(12) United States Patent
Min

(10) Patent No.: US 8,502,253 B2
(45) Date of Patent: Aug. 6, 2013

(54) LIGHT EMITTING DEVICE PACKAGE

(75) Inventor: Bong Kul Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 5 days.

(21) Appl. No.: 13/176,862

(22) Filed: Jul. 6, 2011

(65) Prior Publication Data

US 2012/0275186 A1 Nov. 1, 2012

(30) Foreign Application Priority Data

Apr. 28, 2011 (KR) .......................... 10-2011-0040011

(51) Int. Cl.
*H01L 330/00* (2006.01)

(52) U.S. Cl.
USPC ................. 257/98; 257/99; 257/100

(58) Field of Classification Search
USPC .. 257/81, 82, 98–100, 678, 687, 690; 438/25, 438/26
See application file for complete search history.

(56) References Cited

U.S. PATENT DOCUMENTS

| 6,869,812 B1 * | 3/2005 | Liu | 438/22 |
| 7,705,366 B2 * | 4/2010 | Seo et al. | 257/99 |
| 2004/0062027 A1 * | 4/2004 | Kim et al. | 362/31 |
| 2006/0215388 A1 * | 9/2006 | Hamada | 362/29 |
| 2006/0267040 A1 * | 11/2006 | Baek et al. | 257/99 |
| 2008/0006843 A1 * | 1/2008 | Dai et al. | 257/99 |
| 2011/0012151 A1 * | 1/2011 | Ono | 257/98 |

OTHER PUBLICATIONS

Lee, Benny, "An Overview of ESD Protection Devices", Zener Diodes, (2001).*

* cited by examiner

*Primary Examiner* — N Drew Richards
*Assistant Examiner* — Christina Sylvia
(74) *Attorney, Agent, or Firm* — KED & Associates LLP

(57) ABSTRACT

A light emitting device package includes a body, a first reflective cup and a second reflective cup disposed in a top surface of the body spaced from each other, a connection pad disposed in the top surface of the body spaced apart from the first reflective cup and the second reflective cup, a recess formed in the top surface of the body spaced apart from the first reflective cup, the second reflective cup, and the connection pad, a first semiconductor light emitting device disposed in the first reflective cup, a second semiconductor light emitting device disposed in the second reflective cup, and a Zener diode disposed in the recess, wherein the first reflective cup and the second reflective cup are recessed from the top surface of the body.

20 Claims, 25 Drawing Sheets

LIGHT EMITTING DEVICE PACKAGE

CROSS REFERENCE TO RELATED APPLICATION

This application claims priority under 35 U.S.C. §119 to Korean Application No. 10-2011-0040011, filed in Korea on Apr. 28, 2011, which is hereby incorporated in its entirety by reference as if fully set forth herein.

TECHNICAL FIELD

The present invention relates to a light emitting device package.

BACKGROUND

The light emitting device, for an example, a light emitting diode, is a kind of semiconductor device which converts electric energy to a light and is spot lighted as a next generation light source, replacing the present fluorescent lamps and incandescent lamps.

Since the light emitting diode generates the light by using the semiconductor device, the light emitting diode consumes power very lower than the incandescent lamp which generates the light by heating tungsten or the fluorescent lamp which generates the light by making an UV beam generated from high voltage discharge to hit a phosphors.

And, since the light emitting diode generates the light by using a potential gap of the semiconductor device, the light emitting diode has a long lifetime, and a fast response characteristic, and is environment friendly.

Accordingly, there have been many researches for replacing the present light sources with the light emitting diodes, and, as a result of those, application of the light emitting diodes to lighting devices, such as different lamps used at indoor and outdoor, liquid crystal display apparatus, electric sign boards, street lamps and so on as light sources thereof, is increasing.

SUMMARY

One embodiment is a light emitting device package capable of improving light extraction efficiency, and protecting wires.

A light emitting device package includes a body, a first reflective cup and a second reflective cup positioned in a top surface of the body spaced from each other, a connection pad disposed in the top surface of the body spaced from the first reflective cup and the second reflective cup, a recess formed in the top surface of the body spaced from the first reflective cup, the second reflective cup, and the connection pad, a first semiconductor light emitting device disposed in the first reflective cup, a second semiconductor light emitting device disposed in the second reflective cup, and a Zener diode disposed in the recess.

The body can be positioned around the first reflective cup, the second reflective cup, the connection pad, and the recess, and can include a reflective wall extended upward from the top surface of the body.

The first reflective cup and the second reflective cup can be recessed from the top surface of the body. The first reflective cup, the second reflective cup, and the connection pad can be formed of a material different from the body. The connection pad and the recess can be aligned to face each other. The recess has a depth greater than or equal to ½ of a height of the Zener diode.

The first semiconductor light emitting device can include a first electrode and a second electrode having polarities different from each other, the second semiconductor light emitting device can include a third electrode and a fourth electrode having polarities different from each other, and the Zener diode can include a fifth electrode and a sixth electrode having polarities different from each other.

The light emitting device package can further include a first wire for connecting the first electrode to the first reflective cup, a second wire for connecting the second electrode to the connection pad, a third wire for connecting the connection pad to the third electrode, a fourth wire for connecting the fourth electrode to the second reflective cup, a fifth wire for connecting the fifth electrode to the first reflective cup, and a sixth wire for connecting the sixth electrode to the second reflective cup.

The light emitting device package can further include a first wire for connecting the first electrode to the first reflective cup, a second wire for connecting the second electrode to the second reflective cup, a third wire for connecting the first reflective cup to the third electrode, a fourth wire for connecting the fourth electrode to the second reflective cup, a fifth wire for connecting the fifth electrode to the first reflective cup, and a sixth wire for connecting the sixth electrode to the second reflective cup.

The light emitting device package can further include a first wire for connecting the first electrode to the first reflective cup, a second wire for connecting the second electrode to the third electrode, a third wire for connecting the fourth electrode to the second reflective cup, a fifth wire for connecting the fifth electrode to the first reflective cup, and a sixth wire for connecting the sixth electrode to the second reflective cup.

The light emitting device package can further include an encapsulation material for filling insides of the upper side of the body, the first reflective cup, the second reflective cup, and the recess.

According to another embodiment, a light emitting device package includes a body, a first reflective cup and a second reflective cup positioned in a top surface of the body spaced from each other, a connection pad disposed in the top surface of the body spaced from the first reflective cup and the second reflective cup, a Zener pad disposed in the body spaced from the first reflective cup, the second reflective cup, and the connection pad, and connected to one of the first reflective cup and the second reflective cup electrically, a recess formed in the top surface of the body to expose an upper side of the Zener pad, a first semiconductor light emitting device disposed in the first reflective cup, a second semiconductor light emitting device disposed in the second reflective cup, and a Zener diode disposed on an upper side of the Zener pad exposed from the recess.

The light emitting device package can further include a reflective wall positioned around the first reflective cup, the second reflective cup, the connection pad, the recess, and the Zener pad, and extended upward from the top surface of the body.

The Zener pad can have one end exposed from at least one of a bottom side or a side of the body. The Zener pad and the connection pad can be aligned to face each other. The Zener pad can have an upper side lower than an upper side of the connection pad.

The first semiconductor light emitting device can include a first electrode and a second electrode having polarities different from each other, the second semiconductor light emitting device can include a third electrode and a fourth electrode having polarities different from each other, and the Zener diode can include a fifth electrode and a sixth electrode having polarities different from each other.

The light emitting device package can further include a first wire for connecting the first electrode to the first reflective cup, a second wire for connecting the second electrode to the connection pad, a third wire for connecting the connection pad to the third electrode, a fourth wire for connecting the fourth electrode to the second reflective cup, and a fifth wire for connecting the first reflective cup to the fifth electrode, wherein the sixth electrode is connected to the Zener pad and the Zener pad can be connected to the second reflective cup, electrically.

The light emitting device package can further include a first wire for connecting the first electrode to the first reflective cup, a second wire for connecting the second electrode to the second reflective cup, a third wire for connecting the first reflective cup to the third electrode, a fourth wire for connecting the fourth electrode to the second reflective cup, and a fifth wire for connecting the first reflective cup to the fifth electrode, wherein the sixth electrode is connected to the Zener pad and the Zener pad is connected to the second reflective cup, electrically.

The light emitting device package can further include a first wire for connecting the first electrode to the first reflective cup, a second wire for connecting the second electrode to the third electrode, a third wire for connecting the fourth electrode to the second reflective cup, and a fifth wire for connecting the first reflective cup to the fifth electrode, wherein the sixth electrode is connected to the Zener pad and the Zener pad is connected to the second reflective cup, electrically.

The light emitting device package can further include an insulating member for filling the recess to cover the Zener pad and the Zener diode. The insulating member can include at least one selected from polyphthalamide PPA, $TiO_2$, Si, $SiO_2$.

The Zener pad can include a bent portion connected to the upper side, and a horizontal portion connected to the bent portion and exposed from the one side of the body passed through the one side of the body.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

A thickness or a size of a layer shown in a drawing is exaggerated, omitted or shown schematically for convenience or clarity of description. And, a size of an element is not shown to scale, perfectly. Wherever possible, the same reference numbers will be used throughout the drawings to refer to the same or like parts. A light emitting device package in accordance with a preferred embodiment of the present invention will be described with reference to the attached drawings.

Figure 1:
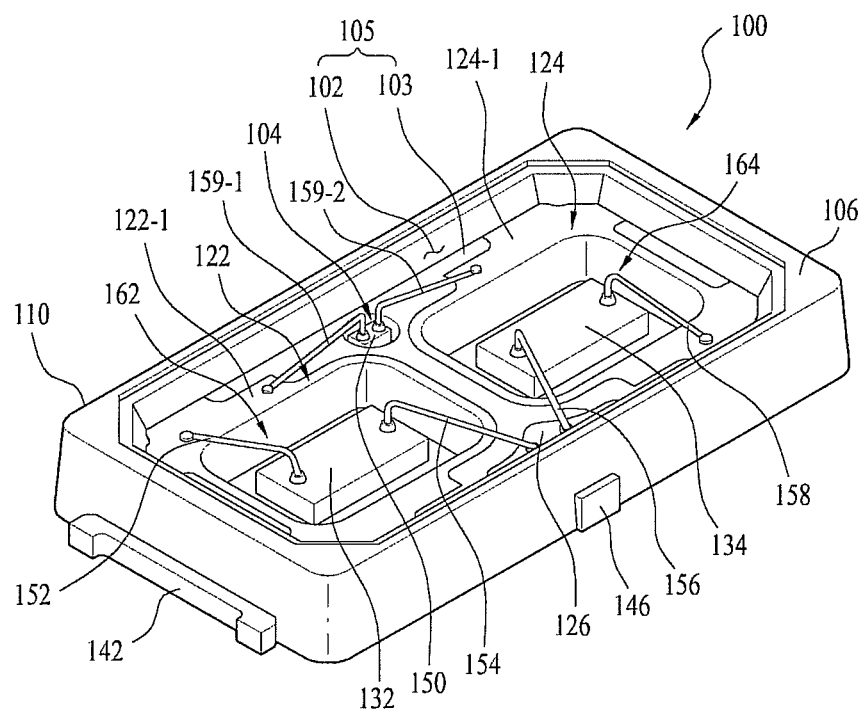
FIG. 1 illustrates a perspective view of a light emitting device package in accordance with a preferred embodiment of the present invention.
Figure 2:
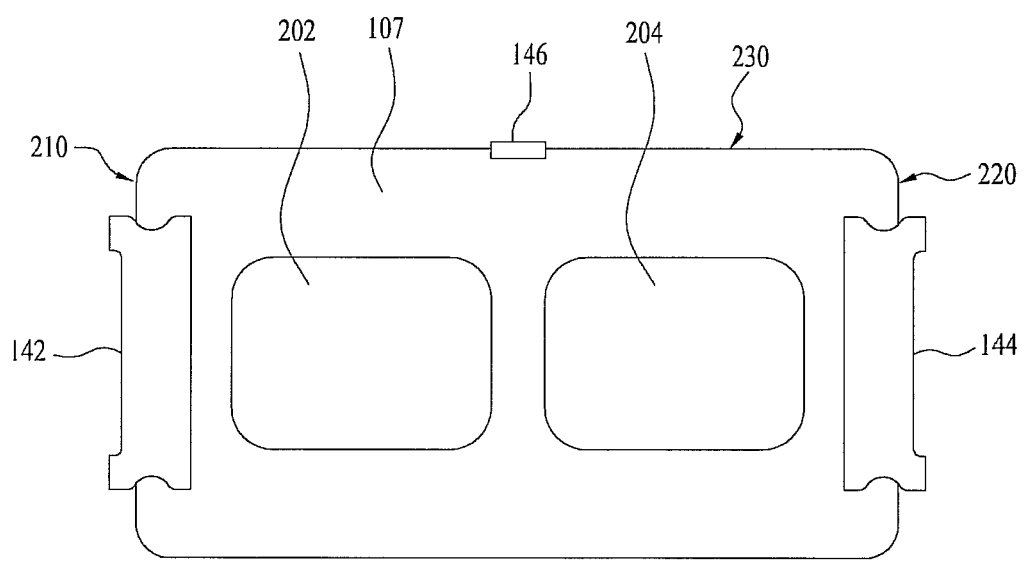
FIG. 2 illustrates a bottom view of the light emitting device package in FIG. 1.
Figure 3:
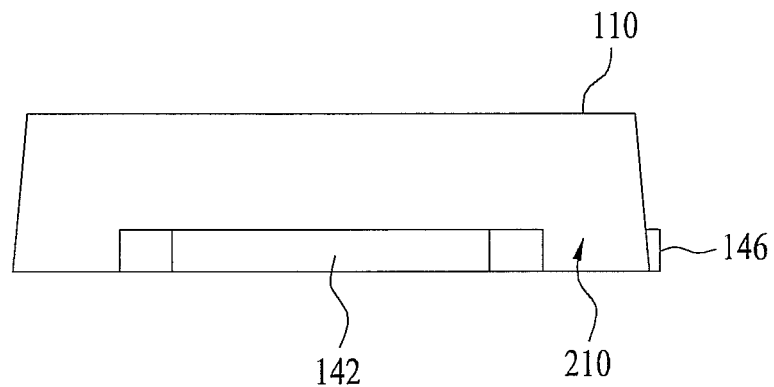
FIG. 3 illustrates a first side view of the light emitting device package in FIG. 1.
Figure 4:
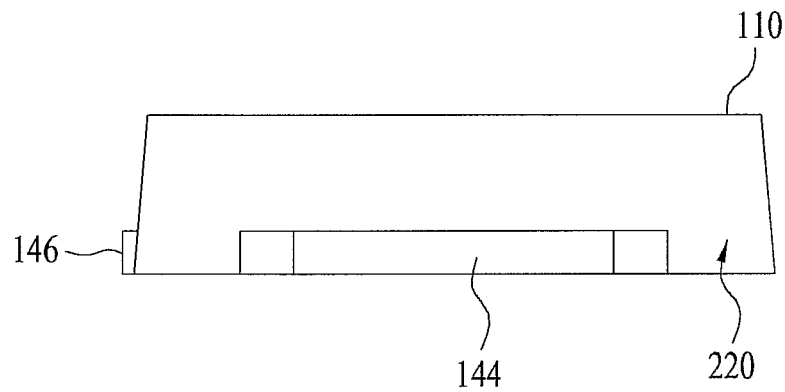
FIG. 4 illustrates a second side view of the light emitting device package in FIG. 1.
Figure 5:
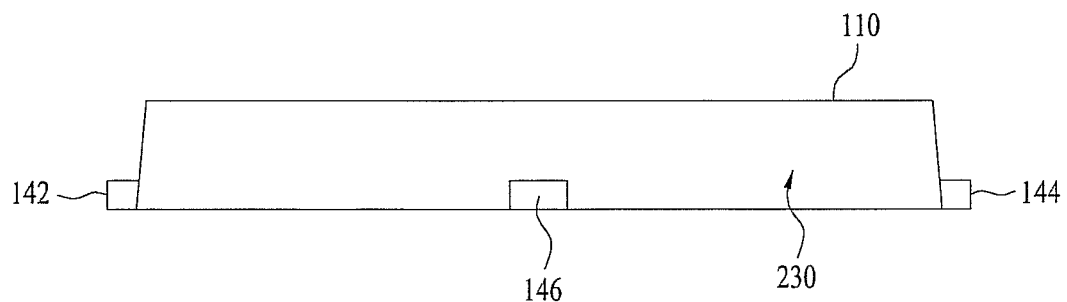
FIG. 5 illustrates a third side view of the light emitting device package in FIG. 1.
Figure 6:
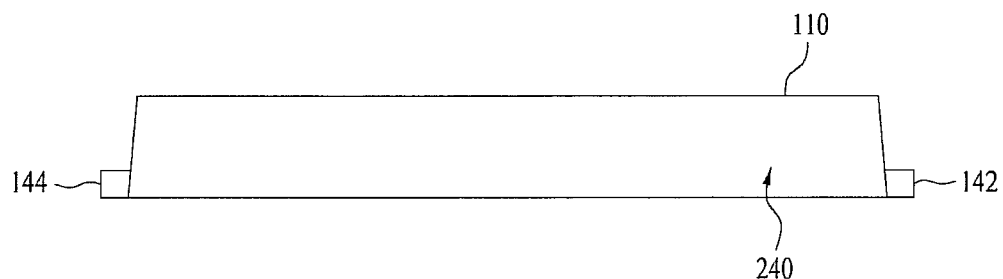
FIG. 6 illustrates a fourth side view of the light emitting device package in FIG. 1.

FIG. 1 illustrates a perspective view of a light emitting device package in accordance with a preferred embodiment of the present invention, FIG. 2 illustrates a bottom view of the light emitting device package in FIG. 1, FIG. 3 illustrates a first side view of the light emitting device package in FIG. 1, FIG. 4 illustrates a second side view of the light emitting device package in FIG. 1, FIG. 5 illustrates a third side view of the light emitting device package in FIG. 1, and FIG. 6 illustrates a fourth side view of the light emitting device package in FIG. 1.

Referring to FIGS. 1 to 6, the light emitting device package 100 includes a body 110, a first reflective cup 122, a second reflective cup 124, a connection pad 126, a first semiconductor light emitting device 132, a second semiconductor light emitting device 134, a Zener diode 150, an insulating member 109, and wires 151~159.

The body 110 can be formed of at least one selected from a resin, such as PPA (Polyphthalamide), silicon Si, metal, PSG (photo sensitive glass), sapphire (Al2O3), and a printed circuit board (PCB).

The body 110 can be made of a conductive material. If the body 110 is made of a conductive material, an insulating film (not shown) can be formed on a surface of the body 110 to prevent the body 110 from shorting of the body 110 with the first reflective cup 122, the second reflective cup 124, and the connection pad 126.

A upper portion 106 of the body 110 seen from above can have a variety of shapes, such as a triangle, a rectangle, a polygon, and a circle, depending on usage and design of the light emitting device package 100.

For an example, the light emitting device package 100 illustrated in FIG. 1 can be applied to an edge type BLU (Backlight unit), and if the light emitting device package 100 is applied to a flashlight or a domestic lighting, the body 110 can be changed to a size and a shape easy to built-in the flashlight or the domestic lighting.

The body 110 includes a top surface 103 and reflective walls. The reflective walls 102 are formed to extend upward from the top surface 103 of the body 110.

That is, the body 110 has a cavity 105 (Hereafter called as a "body cavity") having an opened upper side, sides 102, and a bottom 103. The sides 102 of the cavity 105 can correspond to the reflective walls 102, and the bottom 103 of the cavity 105 can correspond to the top surface of the body 110.

The body cavity 105 can have a shape of a cup, or a recessed container, and the sides 102 of the body cavity 105 can be perpendicular or tilted with respect to the bottom 103.

A shape of the body cavity 105 seen from above can be circular, elliptical, polygonal (for an example, rectangular). The body cavity 105 can have curved corners. The shape of the body cavity 105 in FIG. 7 seen from above can be octagonal on the whole. The body cavity 105 can have 8 facets 102, each of first facets 301~304 can have an area smaller than each of second facets 311~304. The first facets 301~304 can be opposite to each other of the body cavity 105, and the second facets 311~304 can be positioned between the first facets 301~304. For an example, the first facets 301~304 can be sides of the body cavity 105 facing to corners 321~324 of the body 110, respectively. And, some of the first facets 301~304 and the second facets 311~304 can be curved.

The facing ones of the first facets 301~304 and the second facets 311~304 can have forms and areas the same with each other, and some of the facing facets can be curved. As a variation, the sides 102 of the body cavity 105 can include facets smaller or greater than 8 in number, and some of the facing facets can be curved.

The first reflective cup 122 and the second reflective cup 124 can be disposed in the top surface of the body 110 spaced from each other. For an example, the first reflective cup 122 and the second reflective cup 124 can be disposed in the body 110 below the bottom 103 of the body cavity 105 spaced from each other. The first reflective cup 122 is recessed from the bottom of the body cavity 105 with an opened upper side.

The first reflective cup 122 can have a cup structure including a first bottom 122-1, a first upper side 122-3, and a first side 122-2 disposed between the first bottom 122-1 and the first upper side 122-3. The second reflective cup 124 can have a cup structure including a second bottom 124-1, a second upper side 124-3, and a second side 124-2 disposed between the second bottom 124-1 and the second upper side 124-3.

The bottom 103 of the first body cavity 105 can have a first cavity 162 with an opened upper side, sides and a bottom, and the first reflective cup 122 can define the first cavity 162.

The second reflective cup 124 can have a structure spaced from the first cavity 162, in which the second reflective cup 124 is recessed from the bottom of the body cavity 105 with an opened upper side. For an example, the bottom 103 of the body cavity 105 can have a second cavity 164 with an opened upper side, sides and a bottom, and the second reflective cup 124 can define the second cavity 164. In this instance, the second cavity 164 can be spaced from the first cavity 162.

Positioned between the first reflective cup 122 and the second reflective cup 124, there can be a portion 103-1 of the bottom 103 of the body cavity 105, which spaces and isolates the first reflective cup 122 from the second reflective cup 124.

Shapes of the first cavity 162 and the second cavity 164 seen from above can have cup shapes, or recessed container shapes, and the like, and sides thereof can be vertical or sloped with respect to the bottoms thereof.

At least a portion of each of the first reflective cup 122 and the second reflective cup 124 can extend through the body 110 and be exposed to an outside of the body 110. Since at least a portion of each of the first reflective cup 122 and the second reflective cup 124 is exposed to the outside of the body 110, heat dissipation efficiency of heat from the first semiconductor light emitting device 132 and the second semiconductor light emitting device 134 to an outside of the body 110 can be improved.

Figure 17:
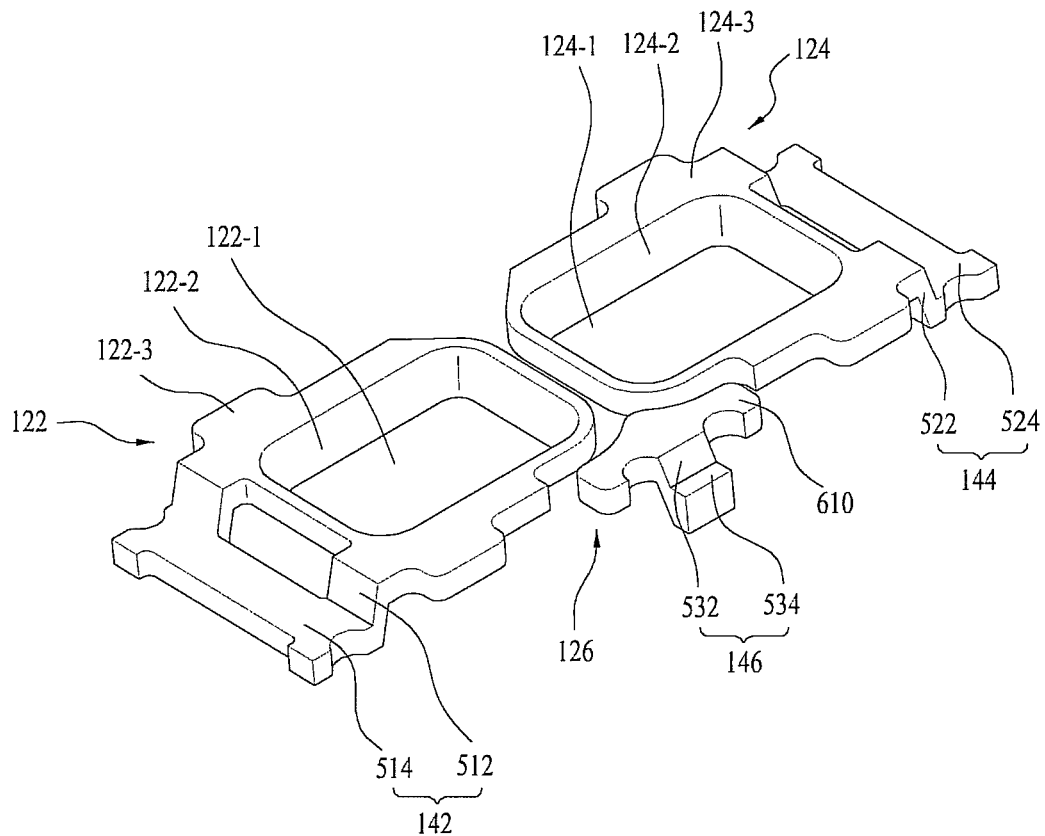
FIG. 17 illustrates a perspective view of the first reflective cup, the second reflective cup and the connection pad shown in FIG. 1.

FIG. 17 illustrates a perspective view of the first reflective cup 122, the second reflective cup 124 and the connection pad 126 shown in FIG. 1.

Referring to FIGS. 1 and 17, the first reflective cup 122 has one end 142 extending through a first side 210 of the body 110 to be exposed to the outside of the body 110. The one end 142 of the first reflective cup 122 will be referred to as a "first lead frame".

The first lead frame 142 is connected to the upper side 122-3 of the first reflective cup 122. The first lead frame 142 includes a first bent portion 512 and a first horizontal portion 514. The first bent portion 512 can be bent toward a rear side 107 of the body 110 from the upper side 122-3 of the first reflective cup 122. An angle formed between the first bent portion 512 and the upper side 122-3 of the first reflective cup 122 can be an acute angle.

The first bent portion 512 can have at least a first hole 501. A portion of the body 110 can fill the first hole 501. The first horizontal portion 514 can be connected to the first bent portion 512, and extend in parallel with the bottom of the first reflective cup 122. A part of the horizontal portion 514 can be exposed from the first side 210 and the rear side 107 of the body 110.

The second reflective cup 124 has one end 144 extending through the second side 220 of the body 110 to be exposed to the outside of the body 110. The one end 144 of the second reflective cup 124 will be referred to as a "second lead frame". The second lead frame 144 is connected to the upper side 124-3 of the second reflective cup 124. The second lead frame 144 has a second bent portion 522 and a second horizontal portion 524. The second bent portion 522 can be bent toward a rear side 107 of the body 110 from the upper side 124-3 of the second reflective cup 124. An angle formed between the second bent portion 522 and the upper side 124-3 of the second reflective cup 124 can be an acute angle.

The second bent portion 522 can have at least a second hole 503. A portion of the body 110 can fill the second hole 503. The second horizontal portion 524 can be connected to the second bent portion 522, and extend in parallel with the bottom of the second reflective cup 124. A part of the second horizontal portion 524 can be exposed from the second side 220 and the rear side 107 of the body 110.

Referring to FIG. 2, the first reflective cup 122 can extend through the body 110 such that a rear side 202 of the first reflective cup 122 is exposed from the rear side 107 of the body 110. And, the one end 142 of the first reflective cup 122 can extend through the first side 210 of the body 110 to project from the first side 210 so as to be exposed to an outside of the body 110.

The second reflective cup 124 can extend through the body 110 such that a rear side 204 of the second reflective cup 124 is exposed from the rear side 107 of the body 110. And, the one end 144 of the second reflective cup 124 can extend through the second side 220 of the body 110 to project from the second side 220 so as to be exposed to an outside of the body 110. The exposed end 142 of the first reflective cup 122 and the exposed end 144 of the second reflective cup 124 can have a variety of shapes, such as rectangle, square, or U-shape.

Since the one ends 142 and 144 and the rear sides 202 and 204 of the first reflective cup 122 and the second reflective cup 124 are exposed to an outside of the body 110, heat dissipation efficiency of heat from the first semiconductor light emitting device 132 and the second semiconductor light emitting device 134 to an outside of the body 110 can be improved.

The connection pad 126 is disposed in the body 110 under the top surface of the body 110 spaced from the first reflective cup 122 and the second reflective cup 124. For an example, the connection pad 126 can be disposed in the body 110 under the top surface of the body 110 spaced from the first reflective cup 122, and the second reflective cup 124.

The bottom 103 of the body cavity 105 can be disposed between the connection pad 126 and the first reflective cup 122 and between the connection pad 126 and the second reflective cup 124.

The connection pad 126 can be disposed adjacent to any one of opposite sides 102 of the body cavity 105. For an example, the connection pad 126 can be disposed adjacent to any one 311 of opposite first facets 311 and 313, or 312 and 314. For an example, a center of the connection pad 126 can be aligned with a center of any one 311 of the first facets opposite to each other.

The connection pad 126 has an upper side 610 exposed from the bottom of the body cavity 105, and one end 146 passed through the third side 230 of the body to expose a portion thereof.

The one end 146 of the connection pad 126 will be called as "a third lead frame".

The third lead frame 146 is connected to an upper side 610 of the connection pad 126. The third lead frame 146 has a third bent portion 532 and a third horizontal portion 534. The third bent portion 532 can be bent toward the rear side 107 of the body 110 from the upper side 610 of the connection pad 126. An angle formed between the third bent portion 532 and the upper side 610 of the connection pad 126 can be an acute angle. The third horizontal portion 534 can be connected to the third bent portion 532. The third horizontal portion 534 can extend in parallel with the upper side 610 of the connection pad 126. A part of the third horizontal portion 534 can be exposed from the third side 230 of the body 110 and the rear side 107.

The upper side 610 of the connection pad 126 can have a thickness T31 of 200 μm~300 μm, and the third lead frame 146 can have a thickness T32 of 0.2 mm~0.3 mm. It is required that the connection pad 126 has an area enough to bond the wires thereto. For an example, the connection pad can have a minimum diameter of 0.15 mm or more passing through a center of the connection pad 126.

At least a portion of the connection pad 126 can be exposed to an outside of the body 110 passed through the body 110. For an example, the one end 146 of the connection pad 126 can be exposed from the rear side 107 of the body 110, and can be exposed to an outside of the body 110 passed through the third side 230 of the body 110. The third side 230 of the body 110 can be any one side vertical to the first side 210 and the second side 220.

The first reflective cup 122, the second reflective cup 124, and the connection pad 126 can be formed of a conductive material that can transmit electricity. For an example, first reflective cup 122, the second reflective cup 124, and the connection pad 126 can be formed of metal, for an example, silver, gold, or copper, or a metal having those plated thereon.

The first reflective cup 122, the second reflective cup 124, and the connection pad 126 can be formed of a material different from a material of the body 110, and may not be integral with the body 100. The first reflective cup 122, and the second reflective cup 124, can have the same size and shape.

The top surface of the body 110 has a recess 104 spaced from the first reflective cup 122, the second reflective cup 124, and the connection pad 126. For an example, the recess 104 can be provided in the bottom 103 of the body cavity 105. A reflective wall 102 is positioned around the first reflective cup 122, the second reflective cup 124, the connection pad 126, and the recess 104, and can be extended upward from the top surface 103 of the body 110.

The connection pad 126 is disposed adjacent to any one 311 of the facing first facets 311 and 313 or 312 and 314, and the recess 104 can be provided adjacent to the other one 313 of the facing facets 311 and 313 or 312 and 314.

For an example, the connection pad 126 can have a center aligned with a center of any one 311 of the opposite first facets, and the recess 104 can have a center aligned with a center of the other one 313 of the opposite first facets. The connection pad 126 and the recess 104 can be aligned opposite to each other. For an example, the center of the connection pad 126 can be aligned with the center of the recess 104. The recess 104 can have a variety of shapes, such as a cylinder, or a polyhedron.

The first semiconductor light emitting device 132 is disposed in the first cavity 162 of the first reflective cup 122, and the second semiconductor light emitting device 134 is disposed in the second cavity 164 of the second reflective cup 124. For an example, the first semiconductor light emitting device 132 is disposed on the bottom 122-1 of the first reflective cup 122, and the second semiconductor light emitting device 134 is disposed on the bottom 124-1 of the second reflective cup 124.

The first semiconductor light emitting device 132 can be spaced from the side 122-2 of the first reflective cup 122, and the second semiconductor light emitting device 134 can be spaced from the side 124-2 of the second reflective cup 124.

Each of the first semiconductor light emitting device 132 and the second semiconductor light emitting device 134 can have a width and a length of 400 μm~1200 μm, and have a thickness of 100 μm~200 μm. For an example, each of the first semiconductor light emitting device 132 and the second semiconductor light emitting device 134 can have a chip size of width×length of 800 μm×400 μm with a thickness of 100 μm~150 μm.

The first semiconductor light emitting device 132, the second semiconductor light emitting device 134, and the connection pad 126 are electrically connected by wires 152,154, 156,158. The wires 159-1 and 159-2 connect the first reflective cup 122 and the second reflective cup 124 to the Zener diode 150 electrically, respectively.

The first wire 152 connects the first semiconductor light emitting device 132 to the first reflective cup 122, and the second wire 154 connects the first semiconductor light emitting device 132 to the connection pad 126, the third wire 156 connects the connection pad 126 to the second semiconductor light emitting device 134, and the fourth wire 158 connects the second semiconductor light emitting device 134 to the second reflective cup 124.

Since the connection pad 126 is spaced and electrically isolated from the first reflective cup 122 and the second reflective cup 124, the connection pad 126 is independent from the first semiconductor light emitting device 132 and the second semiconductor light emitting device 134, electrically. Therefore, since the connection pad 126 can make secure electric serial connection of the first semiconductor light emitting device 132 and the second semiconductor light emitting device 134, the connection pad 126 can improve electric reliability.

The first semiconductor light emitting device 132 and the second semiconductor light emitting device 134 are devices which emit lights as well as heat sources which generate heat. The first reflective cup 122 shields radiation of the heat from the first semiconductor light emitting device 132 which is the heat source to the body 110, and the second reflective cup 124 shields radiation of the heat from the second semiconductor light emitting device 134 which is the heat source to the body 110. That is, the first reflective cup 122 and the second reflective cup 124 isolate the first semiconductor light emitting device 132 and the second semiconductor light emitting device 134 which are the heat sources, thermally. And, the first reflective cup 122 and the second reflective cup 124 serve to shield the lights from the first semiconductor light emitting device 132 and the light from the second semiconductor light emitting device 134 so that the lights do not interfere with each other.

Especially, since the first reflective cup 122 and the second reflective cup 124 are formed in the bottom 103 of the body 110, arranging a portion of the bottom 103 of the body 110 between the first reflective cup 122 and the second reflective cup 124, the thermal isolation between the first reflective cup 122 and the second reflective cup 124 can be improved further, and light interference between the first semiconductor light emitting device 132 and the second semiconductor light emitting device 134 can be suppressed further. At the end, the embodiment enables thermal and optical isolation of the first semiconductor light emitting device 132 from the second semiconductor light emitting device 134.

The Zener diode 150 is disposed in the recess 104 for improvement of a withstand voltage of the light emitting device package 100.

Figure 23:
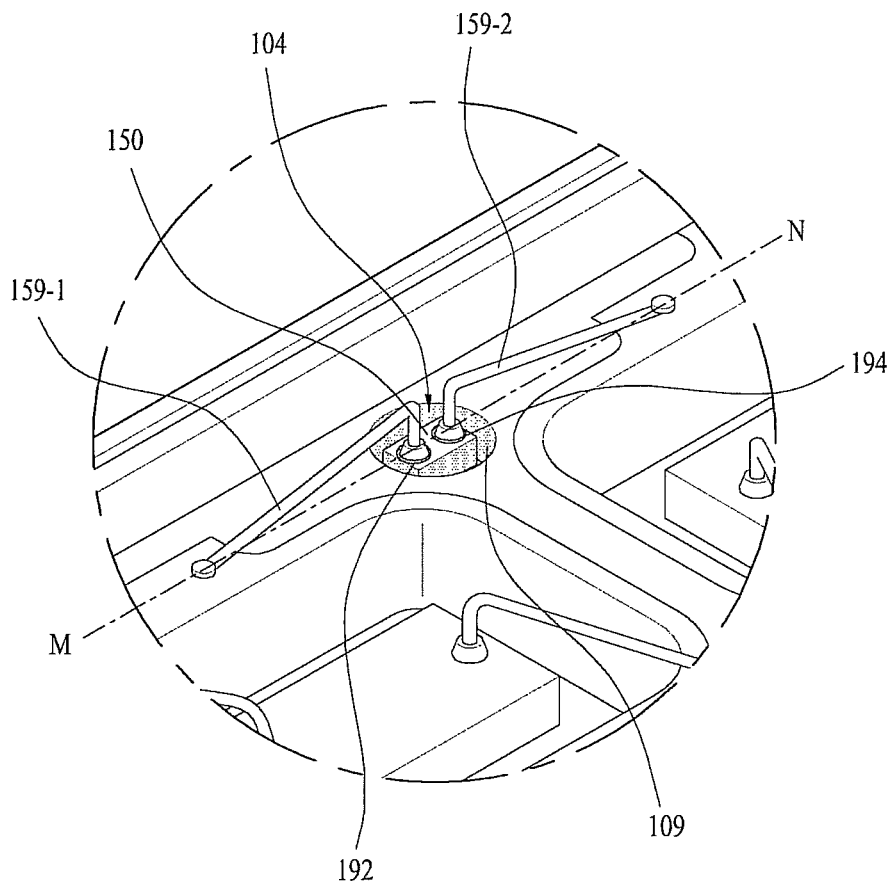
FIG. 23 illustrates an enlarged view of the recess and the Zener diode in FIG. 1.
Figure 24:
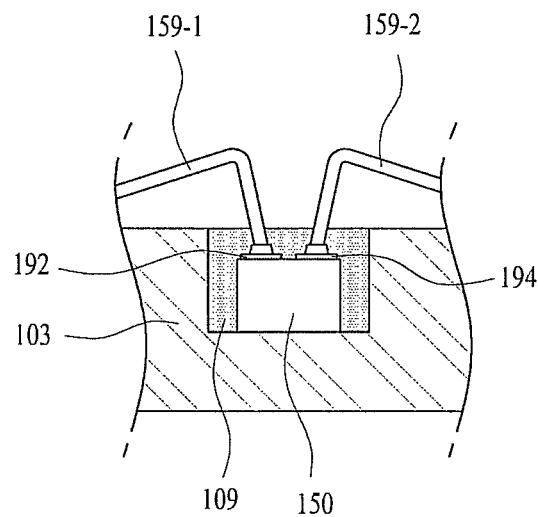
FIG. 24 illustrates a section of the recess and the Zener diode in FIG. 23.

FIG. 23 illustrates an enlarged view of the recess 104 and the Zener diode 150 in FIG. 1, and FIG. 24 illustrates a section of the recess 104 and the Zener diode 150 in FIG. 23.

Referring to FIGS. 23 and 24, the Zener diode 150 can be disposed on a bottom of the recess 104. The fifth wire 159-1 connects the upper side 122-1 of the first reflective cup 122 to the Zener diode 150 electrically, and the sixth wire 159-2 connects the upper side 124-1 of the second reflective cup 124 to the Zener diode 150, electrically.

In a case, the Zener diode is disposed on the upper side of the first reflective cup 122 or the second reflective cup 124, the Zener diode absorbs the light from the first semiconductor light emitting device 132 and the second semiconductor light emitting device 134, causing reduction of light extraction efficiency of the light emitting device package.

However, since the Zener diode 150 is disposed in the recess 104, the Zener diode 150 does not absorb the light from the first semiconductor light emitting device 132 and the second semiconductor light emitting device 134. Accordingly, the embodiment can prevent the light from being absorbed and lost by the Zener diode 150, to reduce a light loss, thereby improving the light extraction efficiency.

The insulating member 109 is filled in the recess 104 having the Zener diode 150 disposed therein, with the fifth wire 159-1 and the sixth wire 159-2 connected thereto. The insulating member 109 surrounds the Zener diode 150 in the recess 104, and can cover a part of the fifth wire 159-1 and a part of the sixth wire 159-2. The insulating member 109 can include at least one of $TiO_2$, Si, and $SiO_2$.

Since the insulating member 109 serves to fasten or support the fifth wire 159-1 and the sixth wire 159-2, the embodiment can suppress disconnection of the wires. In another embodiment, the insulating member 109 is can be omitted.

Figure 7:
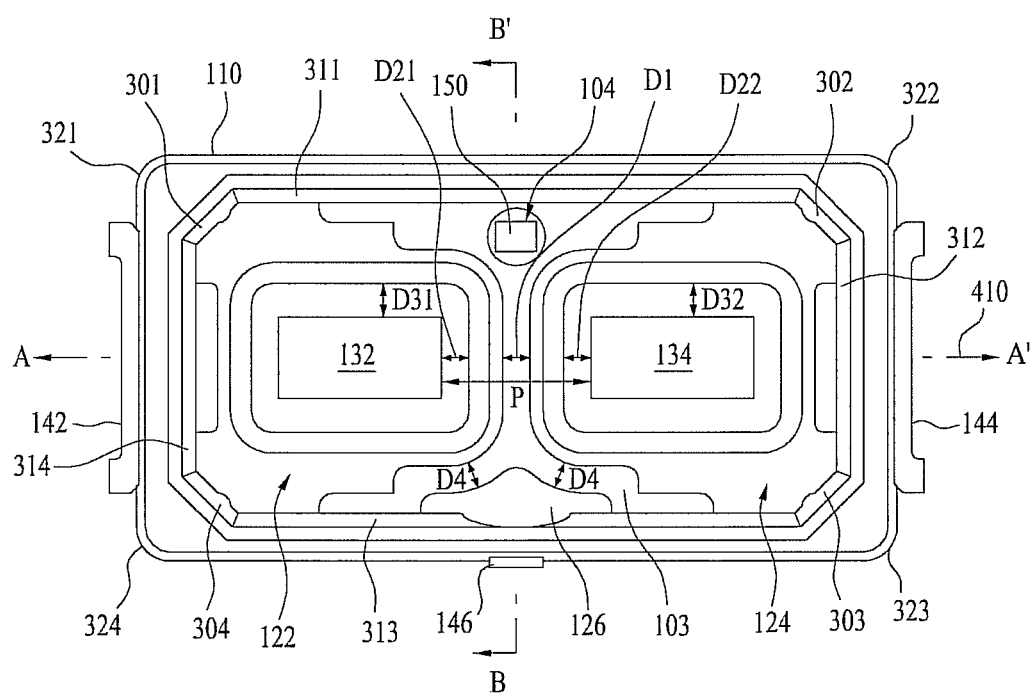
FIG. 7 illustrates a plan view of the light emitting device package in FIG. 1.

FIG. 7 illustrates a plan view of the light emitting device package 100 in FIG. 1. For conveniences' sake, the wires 152~158, 159-1 and 159-2 are not shown.

Referring to FIGS. 1 and 7, the first reflective cup 122 and the second reflective cup 124 can spaced a distance D1 from each other, with the portion 103-1 of the bottom 103 of the body 110 of polyphthalamide disposed therebetween.

In order to isolate the heat sources and make effective shielding of the optical interference between the semiconductor light emitting devices 132 and 134, it is required that the spaced distance D1 between the first reflective cup 122 and the second reflective cup 124 is greater than at least 100 μm.

And, in order to make effective cutting off of the optical interference between the semiconductor light emitting devices 132 and 134, and enhance reflection efficiency, the first semiconductor light emitting device 132 can be disposed on the bottom 122-1 of the first reflective cup 122 spaced a distance away from the side 122-2 of the first reflective cup 122, and the second semiconductor light emitting device 134 can be disposed on the bottom 124-1 of the second reflective cup 124 spaced a distance away from the side 124-2 of the second reflective cup 124.

Distances from the opposite sides of the first reflective cup 122 to the first semiconductor light emitting device 132 can be the same or different from each other. And, distances from the opposite sides of the second reflective cup 124 to the second semiconductor light emitting device 134 can be the same or different from each other. And, a spaced distance D21 from a short side of the first reflective cup 122 to the first semiconductor light emitting device 132 can be the same or different from a spaced distance D22 from a short side of the second reflective cup 124 to the second semiconductor light emitting device 134.

For an example, the spaced distance D21 from the short side of the first reflective cup 122 to the first semiconductor light emitting device 132 can be 150 μm~300 μm, and a spaced distance D31 from the long side of the first reflective cup 122 to the first semiconductor light emitting device 132 can be 150 μm~600 μm. And, the spaced distance D22 from the short side of the second reflective cup 124 to the second semiconductor light emitting device 134 can be 150 μm~350 μm, and a spaced distance D32 from the long side of the second reflective cup 124 to the second semiconductor light emitting device 134 can be 150 μm~600 μm.

A pitch P between the first semiconductor light emitting device 132 disposed in the first reflective cup 122 and the second semiconductor light emitting device 134 disposed in the second reflective cup 124 can be 2 mm~3 mm.

The first semiconductor light emitting device 132 can be mounted on a central portion of the bottom of the first reflective cup 122, and the second semiconductor light emitting device 134 can be mounted on a central portion of the bottom of the second reflective cup 124. For an example, a spaced distance D2 from the short side of the first reflective cup 122 to the first semiconductor light emitting device 132 can be 200 μm, and the spaced distance D31 from the long side of the first reflective cup 122 to the first semiconductor light emitting device 132 can be 500 μm.

The connection pad 126 is spaced a distance D4 from each of the first reflective cup 122 and the second reflective cup 124. The bottom 103 of the body 110, which is made of polyphthalamide, can be disposed between the connection pad 126 and each of the first reflective cup 122 and the second reflective cup 124.

For an example, the spaced distance D4 between the first reflective cup 122 and the connection pad 126 and a spaced distance between the second reflective cup 124 and the connection pad 126 can be the same. And, a spaced distance between the first reflective cup 122 and the recess 104 and the spaced distance between the second reflective cup 124 and the recess 104 can be the same.

The spaced distance D4 between the connection pad 126 and each of the first reflective cup 122 and the second reflective cup 124 can be the same with the spaced distance D1 between the first reflective cup 122 and the second reflective cup 124. And, a spaced distance between the recess 104 and each of the first reflective cup 122 and the second reflective cup 124 can be the same with the spaced distance D1 between the first reflective cup 122 and the second reflective cup 124.

A spaced distance between the first reflective cup 122 and the connection pad 126 can be the same with the spaced distance between the first reflective cup 122 and the recess 104. And, the spaced distance between the second reflective cup 124 and the connection pad 126 can be the same with the spaced distance between the second reflective cup 124 and the recess 104.

Figure 8:
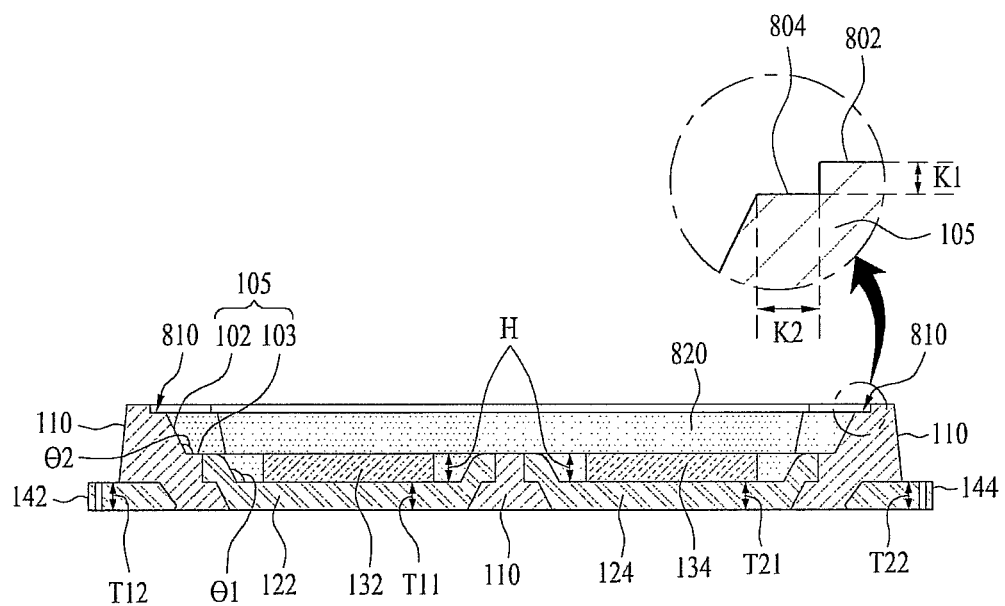
FIG. 8 illustrates a section in an AA' direction of the light emitting device package in FIG. 7.
Figure 9:
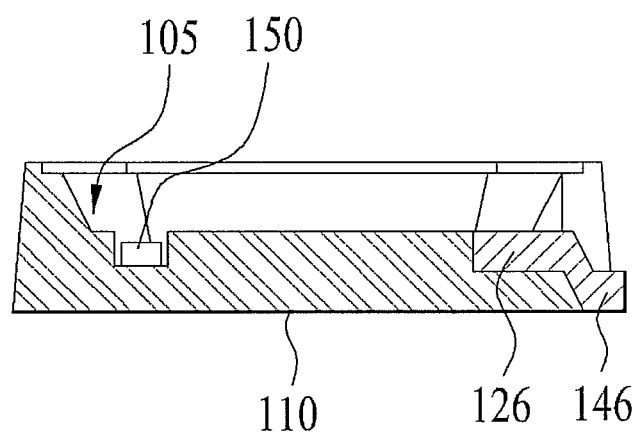
FIG. 9 illustrates a section in a BB' direction of the light emitting device package in FIG. 7.

FIG. 8 illustrates a section in an AA' direction of the light emitting device package in FIG. 7, and FIG. 9 illustrates a section in a BB' direction of the light emitting device package in FIG. 7. The wires 152~158, 159-1 and 159-2 are omitted from FIGS. 8 and 9.

Referring to FIGS. 8 and 9, a tilt angle θ1 of the side of the first reflective cup 122 can be the equal to or different from a tilt angle of the side 102 of the body cavity 105. For an example, an angle θ1 formed between the side 102 and the bottom of the first reflective cup 122 can be 90°~160°.

An angle θ2 between the side 102 and the bottom 103 of the body cavity 105 can be 140°~170°. An upper side of the side 102 of the body cavity 105 has a bent edge. The upper side of the side 102 of the body cavity 105 can have a bent shape. That is, the body cavity 105 has edges 804 disposed between the top side 802 and the bottom 103 of the body 110, and stepped from the top side 802 of the body 110 while extending in parallel to the top side 802 of the body 110.

For an example, a top side of the side 102 of the body cavity 105 can have a step with respect to the top side 802 of the body cavity 105, and the rim portion 804 which is parallel with the top side 802.

The step K1 between the top side 802 and the rim portion 804 of the body cavity 105 can have a height of 50 um~80 μm, and the rim portion 804 can have a length K2 of 50 μm~130 μm. The top side of the side 102 of the body cavity 105 can have at least one aforementioned step.

Thus, the rim portion 804 having the step is provided at the top side of the body cavity 105 for preventing gas from infiltrating into the light emitting device package by providing a lengthy infiltration passage thereby improving air tightness of the light emitting device package 100.

The first reflective cup 122 can have a thickness T11 of 200 μm~300 μm. For an example, thicknesses of the bottom 122-1, the side 122-2, and the upper side 122-3 of the first reflective cup 122 can be 200 μm~300 μm, respectively. The second reflective cup 124 can have a thickness T21 of 200 μm~300 μm. For an example, thicknesses of the bottom 124-1, the side 124-2, and the upper side 124-3 of the second reflective cup 124 can be 200 μm~300 μm, respectively.

A thickness of the one end 142 of the first reflective cup 122 exposed from the first side 210 of the body 110 can be 0.2 mm~0.3 mm, and a thickness of the one end 144 of the second reflective cup 124 exposed from the second side 220 of the body 110 can be 0.2 mm~0.3 mm.

The upper side 122-3 of the first reflective cup 122 and the upper side 124-3 of the second reflective cup 124 can be on the same plane with the bottom 103 of the body cavity 105, and the upper side of the connection pad 126 can be on the same plane with the upper sides of the first reflective cup 122 and the second reflective cup 124. However, the embodiment is not limited to this, but the bottom 103 of the body cavity 105 can be higher than the upper side 122-3 of the first reflective cup 122, the upper side 124-3 of the second reflective cup 124, and the upper side of the connection pad 126.

The connection pad 126 can have a thickness T31 of 200 μm~300 μm, and the one end 146 of the connection pad 126 exposed to an outside of the body 110 can have a thickness of 0.2 mm~0.3 mm.

Referring to FIG. 8, the light emitting device package of the embodiment can have an encapsulation material 820 filled in the body cavity 105 for encapsulating and protecting the first semiconductor light emitting device 132 and the second semiconductor light emitting device 134.

The encapsulation material 820 can be filled, not only in the body cavity 105, but also in the first reflective cup 122 having the first semiconductor light emitting device 132 mounted therein, and the second reflective cup 124 having the second semiconductor light emitting device 134 mounted therein. In embodiments from which the insulating member 109 is omitted, the encapsulation material 820 can be filled in the recess 104. In this instance, the encapsulation material 820 can serve to protect the wires 159-1 and 159-2.

The encapsulation material 820 can be silicone or resin. Though the encapsulation material 820 of silicone or resin can be filled and cured in the body cavity 105, the embodiment does not limit to this.

The encapsulation material 820 can contain a phosphors for changing a light characteristic of the lights from the first semiconductor light emitting device 132 and the second semiconductor light emitting device 134 to produce other color as the lights from the first semiconductor light emitting device 132 and the second semiconductor light emitting device 134 are excited by the phosphors.

For an example, if the light emitting devices 132 and 134 are blue light emitting diodes and the phosphors is a yellow phosphors, the yellow phosphors is excited by the blue light to produce a white color. If the light emitting devices 132 and 134 emit a UV beam, R,G,B three color phosphors can be added to the encapsulation material 820 to produce the white color light. In the meantime, the encapsulation material 820 can have a lens (not shown) placed thereon for adjusting a light distribution of the light from the light emitting device package.

In order to cut off optical interference between the light emitting devices 132 and 134 and improve light reflection efficiency, a height of the first reflective cup 122 and a height of the second reflective cup 124 can be determined taking heights of the light emitting devices 132 and 134 into account. The first reflective cup 122 can have a depth the same with a depth of second reflective cup 124.

Figure 22A:
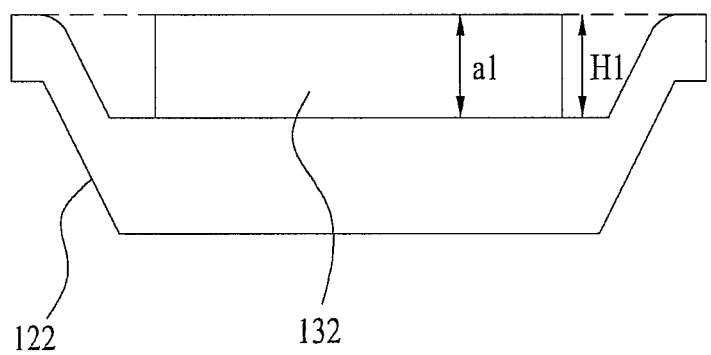
FIG. 22A illustrates a section of a first reflective cup in accordance with a preferred embodiment of the present invention, showing a depth of the first reflective cup.

FIG. 22A illustrates a section of a first reflective cup in accordance with a preferred embodiment of the present invention, showing a depth H1 of the first reflective cup 122.

Referring to FIG. 22A, the upper side 122-3 of the first reflective cup 122 can be flush with the upper side of the first semiconductor light emitting device 132 mounted on the bottom 122-1 of the first reflective cup 122. The depth of the first reflective cup 122 can be equal to the height a1 of the first semiconductor light emitting device 132 (H1=a1). In this instance, the depth H1 can be a distance between the upper side 122-3 and the bottom 122-1 of the first reflective cup 122. Description of the first reflective cup 122 in FIG. 22A can be applied to the second reflective cup 124, identically.

Figure 22B:
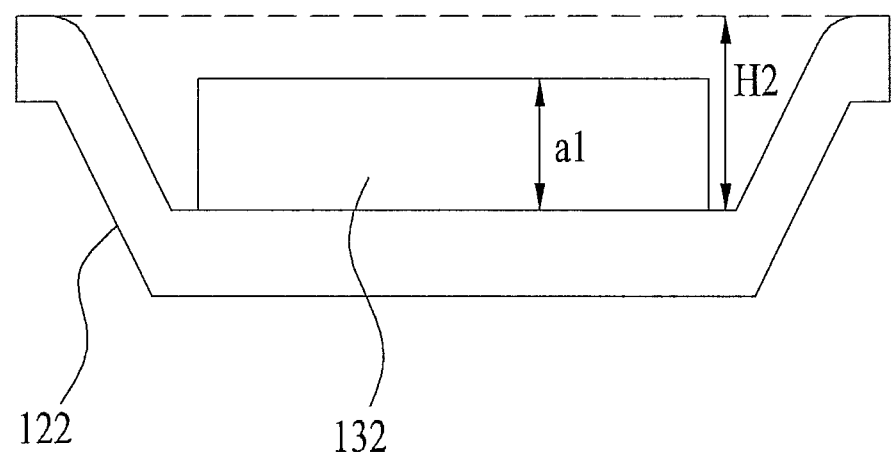
FIG. 22B illustrates a section of a first reflective cup in accordance with another preferred embodiment of the present invention, showing a depth of the first reflective cup.

FIG. 22B illustrates a section of a first reflective cup in accordance with another preferred embodiment of the present invention, showing a depth H2 of the first reflective cup.

Referring to FIG. 22B, the upper side 122-3 of the first reflective cup 122 can be higher than the upper side of the first semiconductor light emitting device 132 mounted on the bottom 122-1 of the first reflective cup 122. That is, the depth of the first reflective cup 122 can be greater than the height a1 of the first semiconductor light emitting device 132 (H1>a1). For an example, the depth H2 of the first reflective cup 122 is greater than the height a1 of the first semiconductor light emitting device 132, but smaller than two times of the height a1 of the first semiconductor light emitting device 132 (a1<H2<2a1). Description of the first reflective cup 122 in FIG. 22B can be applied to the second reflective cup 124, identically.

Figure 22C:
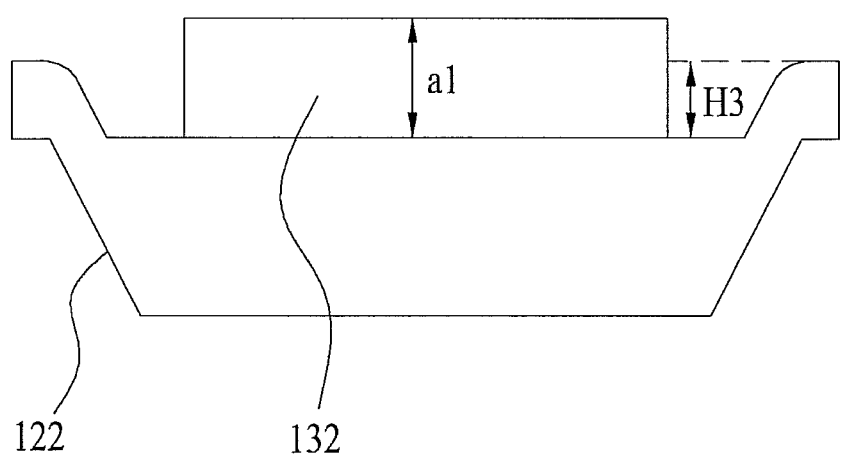
FIG. 22C illustrates a section of a first reflective cup in accordance with another preferred embodiment of the present invention, showing a depth of the first reflective cup.

FIG. 22C illustrates a section of a first reflective cup in accordance with another preferred embodiment of the present invention, showing a depth H3 of the first reflective cup.

Referring to FIG. 22C, the upper side 122-3 of the first reflective cup 122 can be lower than the upper side of the first semiconductor light emitting device 132 mounted on the first reflective cup 122. The depth H3 of the first reflective cup 122 can be smaller than the height a1 of the first semiconductor light emitting device 132 (H3<a1).

For an example, the depth H3 of the first reflective cup 122 is smaller than the height a1 of the first semiconductor light emitting device 132, but greater than an ½times of the height a1 of the first semiconductor light emitting device 132 (a1/2<H3<a1). Description of the first reflective cup 122 in FIG. 22B can be applied to the second reflective cup 124, identically.

Figure 25A:
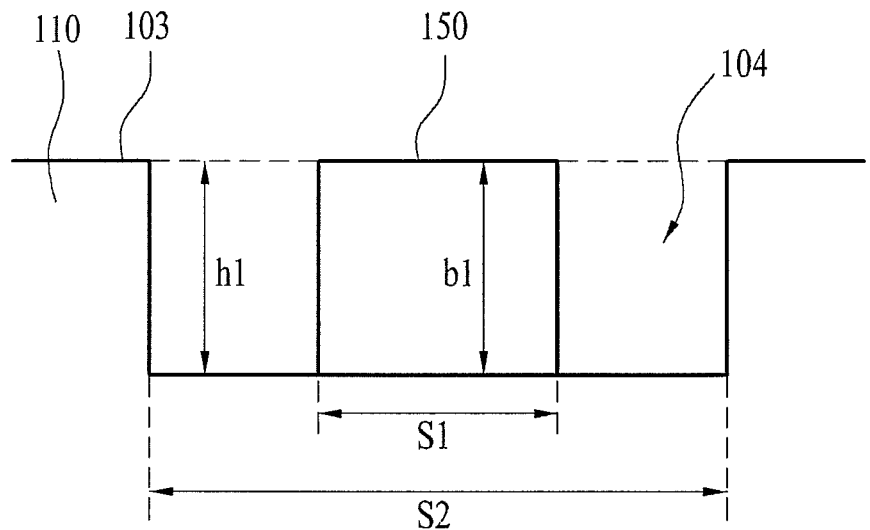
FIG. 25A illustrates a section of a recess showing a depth and a diameter thereof in accordance with a preferred embodiment of the present invention.

FIG. 25A illustrates a section of a recess 104 indicating a depth h1 and a diameter S2 thereof in accordance with a preferred embodiment of the present invention.

Referring to FIG. 25A, the bottom 103 of the body cavity 105 can be in parallel with the upper side of the Zener diode 150 disposed in the recess 104. The depth h1 of the recess 104 can be equal to a height b1 of the Zener diode 150 (h1=b1). In this instance, the depth h1 can be a distance between the bottom 103 of the body cavity 105 and the bottom of the recess 104.

The recess 104 has a diameter S2 greater than at least a diameter S1 of the Zener diode 150 (S2>S1). In this instance, the diameter S1 of the Zener diode 150 can be a length of a long side of the Zener diode 150.

Figure 25B:
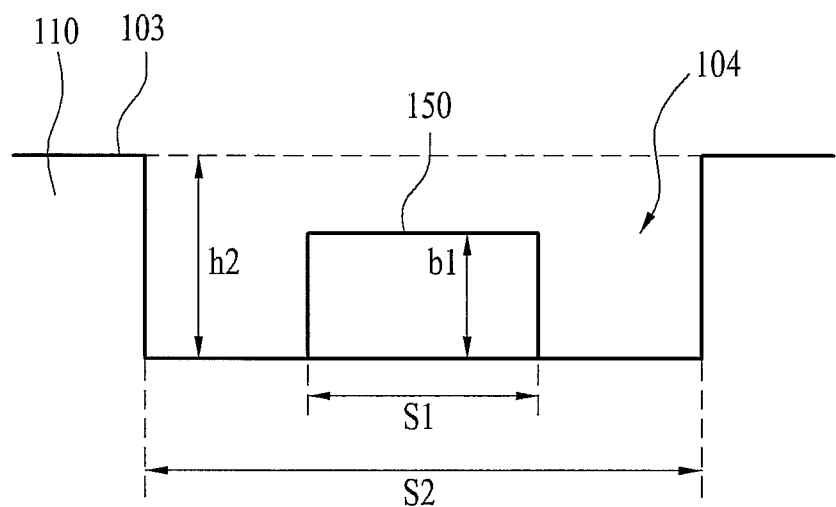
FIG. 25B illustrates a section of a recess showing a depth and a diameter thereof in accordance with another preferred embodiment of the present invention.

FIG. 25B illustrates a section of a recess indicating a depth h2 and a diameter S2 thereof in accordance with another preferred embodiment of the present invention.

Referring to FIG. 25B, the bottom 103 of the body cavity 105 can be higher than the upper side of the Zener diode 150 disposed on the bottom of the recess 104. The depth h2 of recess 104 can be greater than ½ of a height b1 of the Zener diode 150 (h2>b1/2).

Figure 25C:
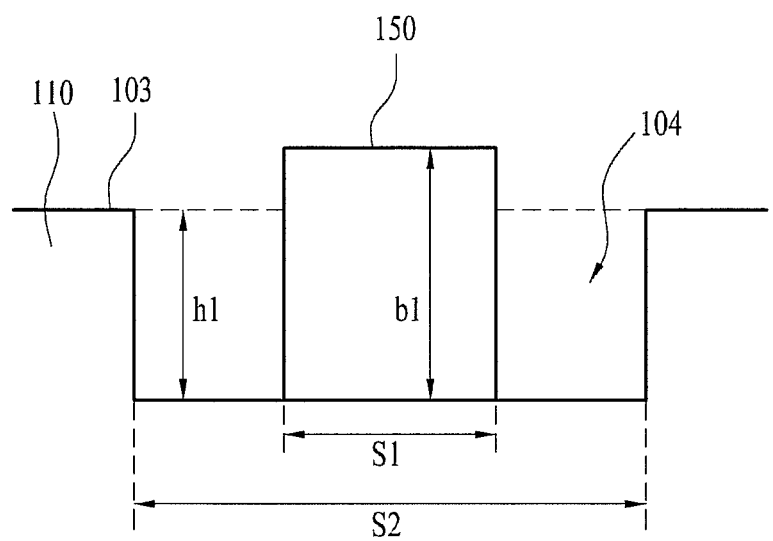
FIG. 25C illustrates a section of a recess showing a depth and a diameter thereof in accordance with another preferred embodiment of the present invention.

FIG. 25C illustrates a section of a recess indicating a depth h3 and a diameter S2 thereof in accordance with another preferred embodiment of the present invention.

Referring to FIG. 25C, the bottom 103 of the body cavity 105 can be lower than the upper side of the Zener diode 150 disposed on the bottom of the recess 104. The depth h3 of the recess 104 can be smaller than a height b1 of the Zener diode 150 (h2<b1).

The diameter of the recess 104 can be 1.1 times~5 times of the diameter S1 of the Zener diode 150, and the depth of the recess 104 can be 5 times greater than the height of the Zener diode 150.

For an example, a width and a length of the Zener diode 150 can be 150 μm~200 μm, and the height of the Zener diode 150 can be 100 μm~150 μm. And, a width and a length of the recess 104 can be 165 μm~1000 μm, and a depth of the recess 104 can be 100 μm~650 μm.

Figure 10:
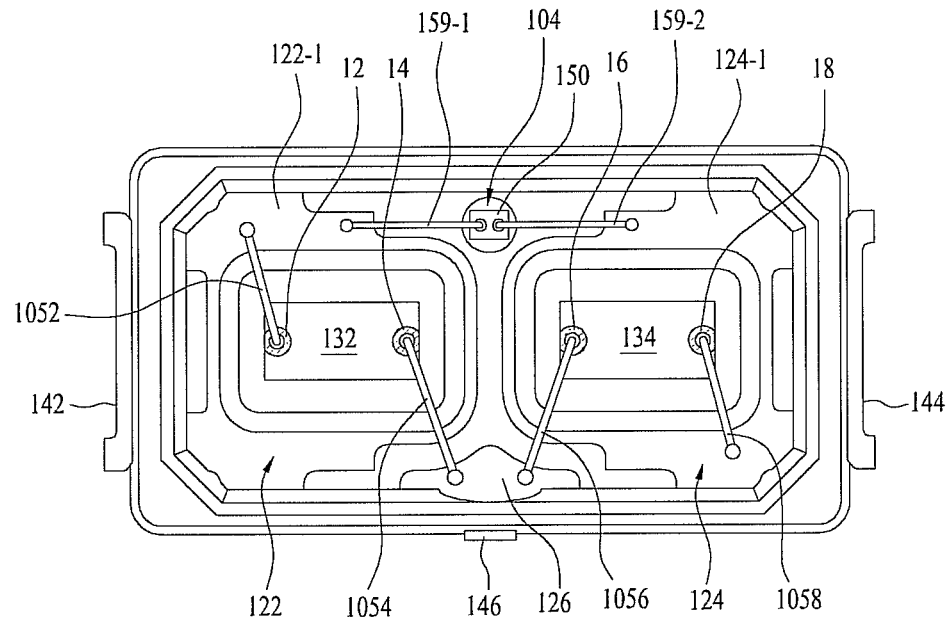
FIG. 10 illustrates a plan view of a light emitting device package in accordance with a preferred embodiment of the present invention, showing serial connection between light emitting devices therein.

FIG. 10 illustrates a plan view of a light emitting device package in accordance with a preferred embodiment of the present invention, showing serial connection between light emitting devices therein. As shown in FIG. 10, the first wire 1052 can have one end bonded to the upper side 122-1 of the first reflective cup 122, and the other end bonded to the first semiconductor light emitting device 132. And, a second wire 1054 can have one end bonded to the first semiconductor light emitting device 132, and the other end bonded to the connection pad 126.

And, the third wire 1056 can have one end bonded to the connection pad 126, and the other end bonded to the second semiconductor light emitting device 134.

The fifth wire 159-1 can have one end bonded to the upper side 122-1 of the first reflective cup 122, and the other end bonded to the Zener diode 150. The sixth wire 159-2 can have one end bonded to the upper side 124-1 of the second reflective cup 124, and the other end bonded to the Zener diode 150.

The light emitting devices 132 and 134 in FIG. 10 can be connected in series electrically by the bonding of the first to fourth wires 1052 to 1058. The serial connection between the light emitting devices 132 and 134 in FIG. 10 uses the connection pad 126 as an independent medium from the light emitting devices 132 and 134, enabling electric secure serial connection of the first semiconductor light emitting device 132 and the second semiconductor light emitting device 134, thereby improving electric reliability of the light emitting device package.

Figure 11:
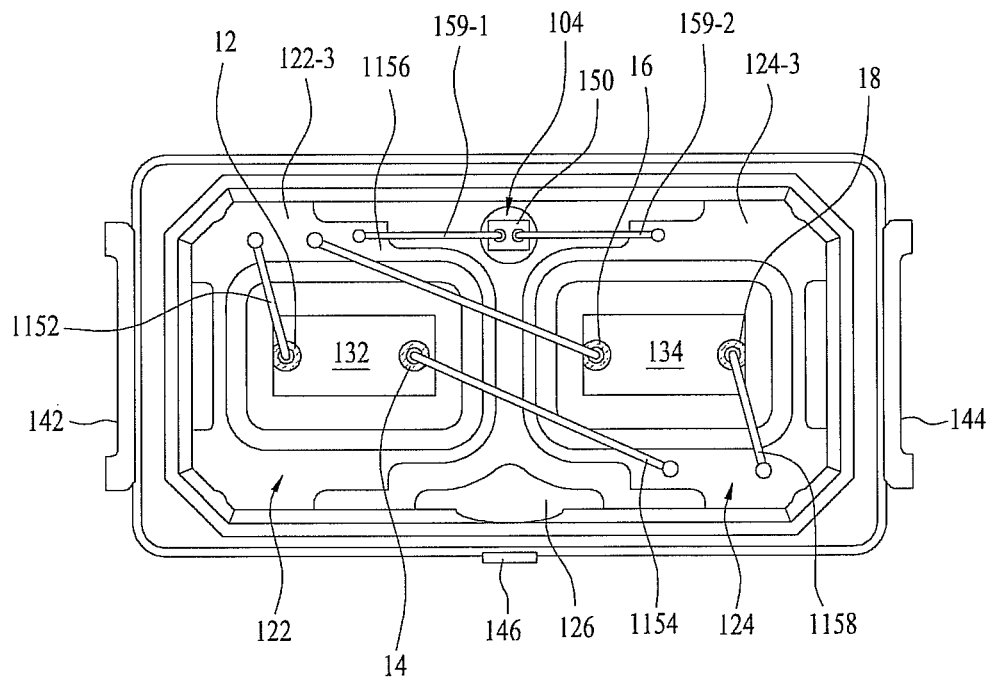
FIG. 11 illustrates a plan view of a light emitting device package in accordance with another preferred embodiment of the present invention, showing parallel connection between the light emitting devices.

FIG. 11 illustrates a plan view of a light emitting device package in accordance with another preferred embodiment of the present invention, showing parallel connection between the light emitting devices. As shown in FIG. 11, the first wire 1152 can have one end bonded to the upper side 122-1 of the first reflective cup 122, and the other end bonded to the first semiconductor light emitting device 132.

The second wire 1154 can have one end bonded to the first semiconductor light emitting device 132, and the other end bonded to the upper side 124-1 of the second reflective cup 124. The third wire 1156 can have one end bonded to the upper side 122-1 of the first reflective cup 122, and the other end bonded to the second semiconductor light emitting device 134. Finally, the fourth wire 1152 can have one end bonded to the second semiconductor light emitting device 134, and the other end bonded to the upper side 124-1 of the second reflective cup 124. Accordingly, the light emitting devices 132 and 134 in FIG. 11 can be connected in parallel electrically by the bonding of the first to fourth wires 1154~1158.

Figure 12:
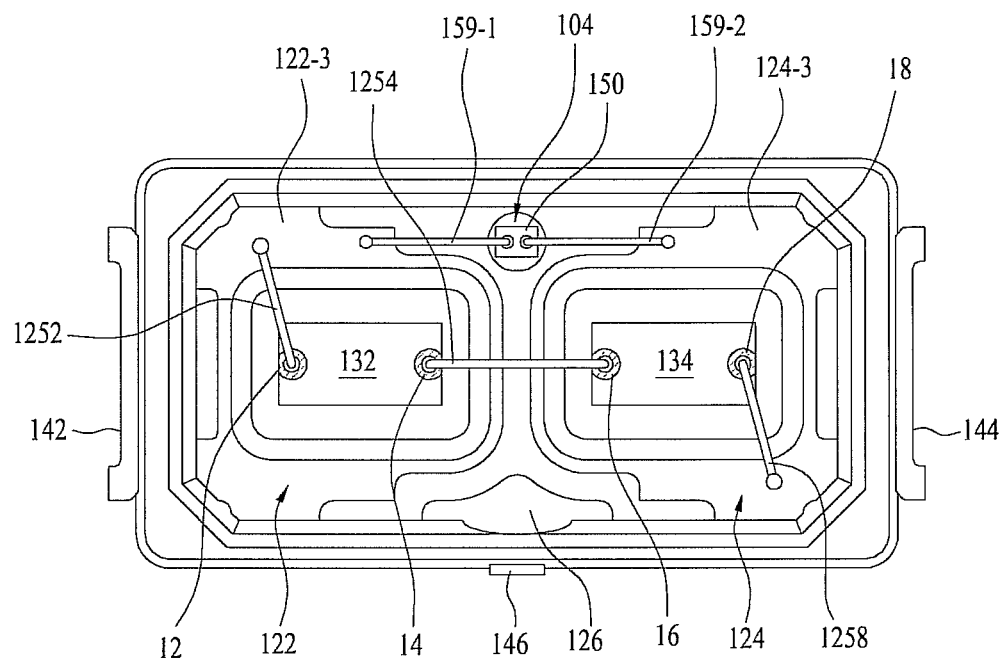
FIG. 12 illustrates a plan view of a light emitting device package in accordance with another preferred embodiment of the present invention, showing serial connection between the light emitting devices.

FIG. 12 illustrates a plan view of a light emitting device package in accordance with another preferred embodiment of the present invention, showing serial connection between the light emitting devices. As shown in FIG. 12, the first wire 1252 can have one end bonded to the upper side 122-1 of the first reflective cup 122, and the other end bonded to the first semiconductor light emitting device 132. And, the second wire 1254 can have one end bonded to the first semiconductor light emitting device 132, and the other end bonded to the second semiconductor light emitting device 134, directly. The third wire 1256 can have one end connected to the second semiconductor light emitting device 134, and the other end bonded to the upper side 124-1 of the second reflective cup 124.

The light emitting devices 132 and 134 in FIG. 12 can be connected in series by bonding the first to third wires 1252~1256. Different from FIG. 10, the first semiconductor light emitting device 132 and the second semiconductor light emitting device 134 can be connected directly with each other by using the second wire 1254, without using the connection pad 126 as a medium.

Since the Zener diode 150 is disposed in the recess 104, heights of the wires 159-1 and 159-2 bonded to the Zener diode 150 can be lower than heights of the wires 1052~1058, 1152~1158, and 1252~1258 bonded to the first reflective cup 122, the second reflective cup 124, the first semiconductor light emitting device 132, and the second semiconductor light emitting device 134. Accordingly, possibility of disconnection of the wires 159-1 and 159-2 bonded to the Zener diode 150 can be reduced compared to other wires.

As described before, the embodiment suggests, not a one cup type light emitting device package, but a two cup type light emitting device package in which the light emitting devices 132 and 134 are mounted in the two separate reflective cups 122 and 124 in the body 110, respectively. Owing to such a structure, the semiconductor light emitting devices 132 and 134 can be isolated from each other, and heat generated by the semiconductor light emitting devices 132 and 134 can be blocked by the reflective cups 122 and 124, thereby, preventing discoloration of the body 110 due to the heat, and thus extending a lifetime of the light emitting device package 100. The isolation of the two reflective cups 122 and 124 enables to prevent interference of the lights from the light emitting devices 132 and 134 with each other.

Figure 26:
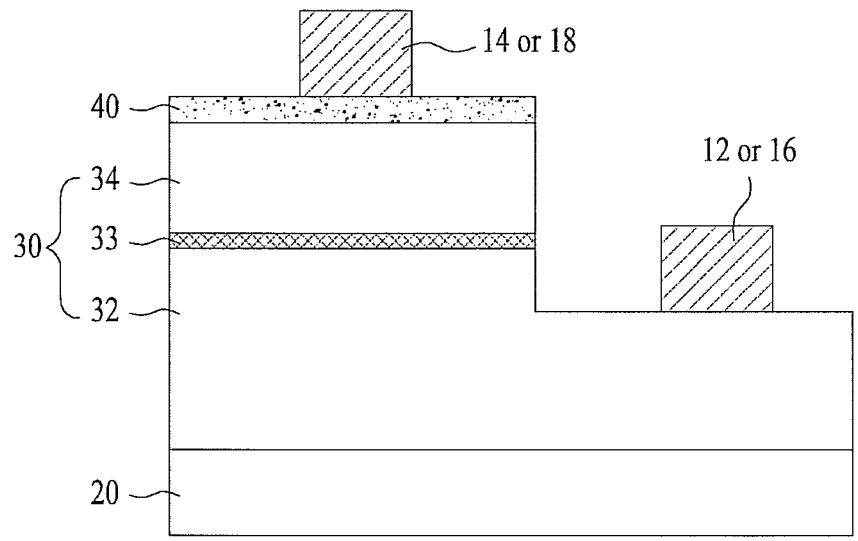
FIG. 26 illustrates a section of the light emitting device package in FIG. 1 showing a the first semiconductor light emitting device and the second semiconductor light emitting device in accordance with a preferred embodiment of the present invention.

FIG. 26 illustrates a section of the light emitting device package in FIG. 1, showing a the first semiconductor light emitting device 132 and the second semiconductor light emitting device 134 in accordance with a preferred embodiment of the present invention. As shown in FIG. 26, the first semiconductor light emitting device 132 includes a substrate 20, a light emitting structure 30, a conductive layer 40, a first electrode and a second electrode 14. The second semiconductor light emitting device 134 includes a substrate 20, a light emitting structure 30, a conductive layer 40, a third electrode 14 and a fourth electrode 18. The second semiconductor light emitting device 134 in FIG. 1 can have a configuration identical to the first semiconductor light emitting device 132. The first electrode 12 can have a polarity different form the second electrode 14, and the third electrode 16 can have a polarity different from the fourth electrode 18.

The substrate 20 can be formed of a material which can support the light emitting structure 30 and has light transmittivity, for an example, sapphire, silicon Si, ZnO, and a nitride semiconductor, or a template substrate having at least one of GaN, InGaN, AlGaN, AlInGaN, SiC, GaP, InP, $Ga_2O_3$, and GaAs stacked thereon.

The light emitting structure 30 includes a first conductive type semiconductor layer 32, an active layer 33, and a second conductive type semiconductor layer 34. The first conductive type semiconductor layer 32 can include, for an example, an n type semiconductor layer, wherein the n type semiconductor layer can be selected from a semiconductor material having composition of $In_xAl_yGa_{1-x-y}N$ ($0 \leq y \leq 1$, $0 \leq y \leq 1$, $0 \leq x+y \leq 1$), for an example, GaN, AlN, AlGaN, InGaN, InN, InAlGaN, AlInN, doped with an n type dopant, such as Si, Ge, Sn, Se, Te.

The active layer 33 is disposed on the first conductive type semiconductor layer 32. The active layer 33 can include, for an example, a semiconductor material having composition of $In_xAl_yGa_{1-x-y}N$ ($0 \leq x \leq 1$, $0 \leq y \leq 1$, $0 \leq x+y \leq 1$), and can include at least one selected from a quantum wire structure, a quantum dot structure, a single quantum well structure, and a multi quantum well structure MQW.

The active layer 33 can emit a light from energy generated in a process of recombination of an electron and a hole provided from the first semiconductor layer 32 and the second conductive type semiconductor layer 34. The active layer is a layer that can emit a light of different wavelengths, and the present invention does not limit a range of wavelengths the active layer can emit.

The second conductive type semiconductor layer 34 is disposed on the active layer 33. The second conductive type semiconductor layer 34 can be, for an example, a p type semiconductor layer selected from semiconductor materials having composition of $In_xAl_yGa_{1-x-y}N$ ($0 \leq x \leq 1$, $0 \leq y \leq 1$, $0 \leq x+y \leq 1$), for an example, GaN, AlN, AlGaN, InGaN, InN, InAlGaN, AlInN, and can be doped with a p type dopant, such as Mg, Zn, Ca, Sr, Ba.

The light emitting structure 30 can have the second conductive type semiconductor layer 34, the active layer 33 and a portion of the first conductive type semiconductor layer 32 mesa etched to expose a region of the first conductive type semiconductor layer 32.

The conductive layer 40 is disposed on the second conductive type semiconductor layer 34. Since the conductive layer 40 not only reduces total reflection, but also has good light transmissivity, the conductive layer 40 can increase extraction efficiency of the light emitted from the active layer to the second conductive type semiconductor layer 34. The conductive layer 40 can be formed of a transparent oxide group material having high transmissivity on a wavelength of a light. For an example, the transparent oxide group material can be ITO (Indium Tin Oxide), TO (Tin Oxide), IZO (Indium Zinc Oxide), and ZnO (Zinc Oxide). The conductive layer 40 can be omitted from another embodiment.

The first electrode 12 or the third electrode 16 can be disposed on the exposed region of the first conductive type semiconductor layer 32, and the second electrode 14 or the fourth electrode 18 can be disposed on the second conductive type semiconductor layer 34 or the conductive layer 40. The first electrode 12 and the third electrode 16 can be n type electrodes, and the second electrode 14 and the fourth electrode 18 can be p type electrodes. Each of the first to fourth electrodes 12, 14, 16, and 18 can be a single layer or a multi-layer of a metal or an alloy including at least one selected from Ti, Al, an Al alloy, In, Ta, Pd, Co, Ni, Si, Ge, Ag, an Ag alloy, Au, Hf, Pt, Ru, and Au. FIGS. 10~12 illustrate the first to fourth electrodes 12~18.

Referring to FIG. 10, one of the first electrode 12 and the second electrode 14 can be connected to the first reflective cup 122 electrically, and one of the third electrode 16 and the fourth electrode 18 can be connected to the second reflective cup 124 electrically. And, the connection pad 126 can connect the other one of the first electrode 12 and the second electrode 14 to the other one of the third electrode 16 and the fourth electrode 18, electrically.

For example, the first wire 1052 can connect the first electrode 12 of the first semiconductor light emitting device 132 to the first reflective cup 122 electrically, and the fourth wire 1058 can connect the fourth electrode 18 of the second semiconductor light emitting device 134 to the second reflective cup 124, electrically.

The connection pad 126 can connect the second electrode 14 of the first semiconductor light emitting device 132 and the third electrode 16 of the second semiconductor light emitting device 134 by the second wire 1054 and the third wire 1056, electrically.

The second wire 1054 can connect the second electrode 14 of the first semiconductor light emitting device 132 to the connection pad 126 electrically, and the third wire 1056 can connect the third electrode 16 of the second semiconductor light emitting device 134 to the connection pad 126, electrically.

The Zener diode 150 can includes electrodes 192 and 194 having polarities different from each other. For an example, the Zener diode 150 can includes a fifth electrode 192 and a sixth electrode 194, and the fifth electrode 192 and the sixth electrode 194 can have polarities different from each other. The fifth electrode 192 and the sixth electrode 194 can have power supplied thereto from power sources different from each other.

And, the fifth wire 159-1 can connect the fifth electrode 192 to the first reflective cup 122 electrically, and the sixth wire 159-2 can connect the sixth electrode 194 to the second reflective cup 124.

Referring to FIG. 11, any one of the first electrode 12 and the second electrode 14 is connected to the first reflective cup 122 electrically, and any one of the third electrode 16 and the fourth electrode 18 is connected to the second reflective cup 124, electrically. The other one of the first electrode 12 and the second electrode 14 can be connected to the second reflective cup 124 electrically, and the other one of the third electrode 16 and the fourth electrode 18 can be connected to the first reflective cup 122, electrically.

For an example, the first wire 1152 can connect the first electrode 12 of the first semiconductor light emitting device 132 to the first reflective cup 122 electrically, and the fourth wire 1158 can connect the fourth electrode 18 of the second semiconductor light emitting device 134 to the second reflective cup 124, electrically.

The second wire 1154 can connect the second electrode 14 to the second reflective cup 124 electrically, and the third wire 1156 can connect the third electrode 16 to the first reflective cup 122, electrically.

Referring to FIG. 12, any one of the first electrode 12 and the second electrode 14 is connected to the first reflective cup 122 electrically, and any one of the third electrode 16 and the fourth electrode 18 is connected to the second reflective cup 124, electrically. The other one of the first electrode 12 and the second electrode 14 is connected to the other one of the third electrode 16 and the fourth electrode 18.

For an example, the first wire 1252 can connect the first electrode 12 of the first semiconductor light emitting device 132 to the first reflective cup 122 electrically, and the fourth wire 1258 can connect the fourth electrode 18 of the second semiconductor light emitting device 134 to the second reflective cup 124, electrically. The second wire 1254 can connect the second electrode 14 to the third electrode 16, electrically.

Figure 13:
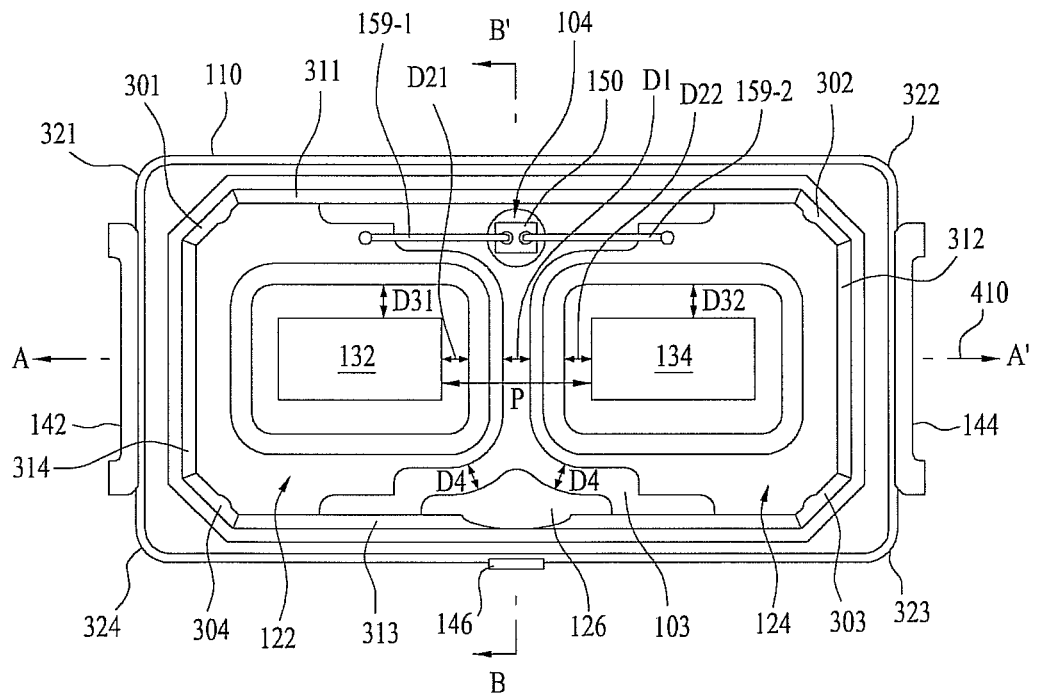
FIG. 13 illustrates a plan view of a light emitting device package in accordance with another preferred embodiment of the present invention.
Figure 14:
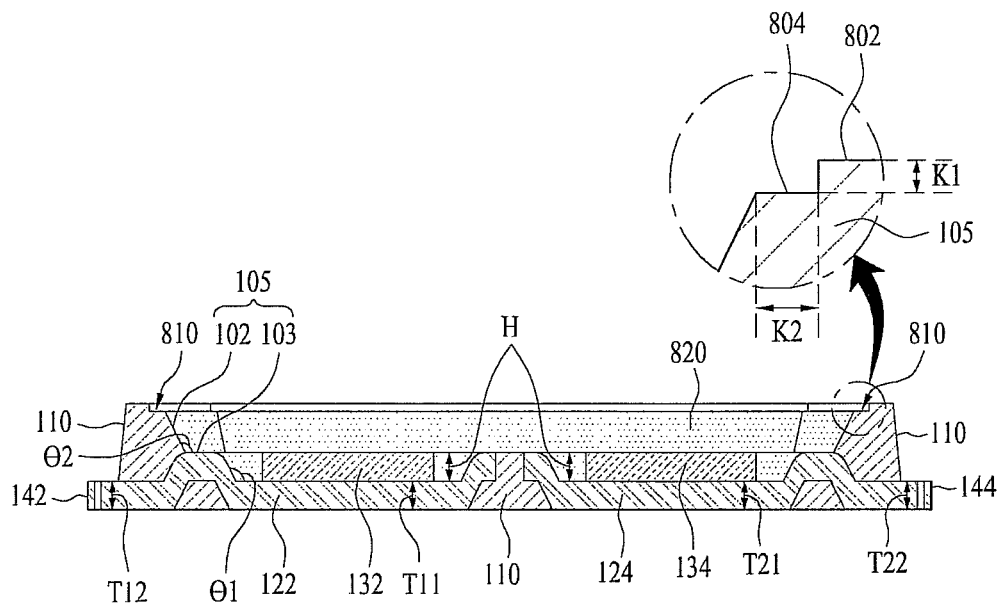
FIG. 14 illustrates a section in an AA' direction of the light emitting device package in FIG. 13.
Figure 18:
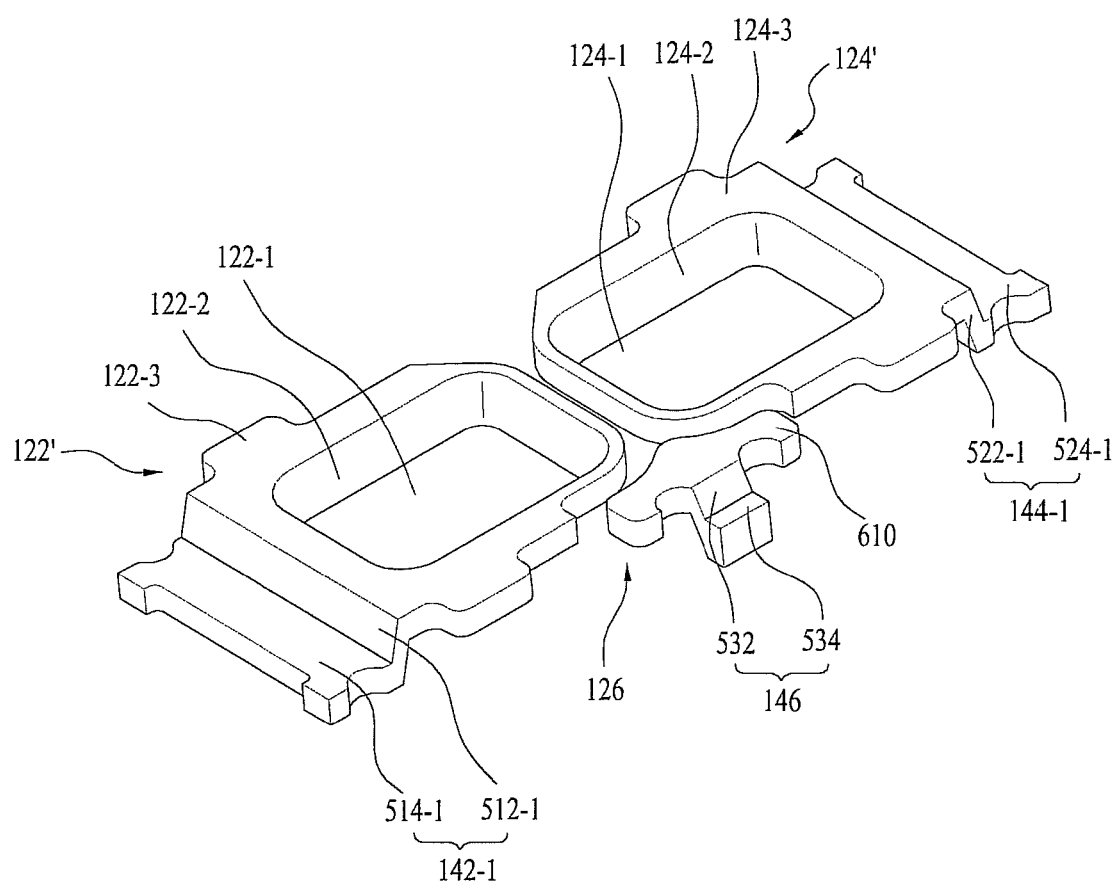
FIG. 18 illustrates a perspective view of the first reflective cup, the second reflective cup and the connection pad shown in FIG. 13.

FIG. 13 illustrates a plan view of a light emitting device package in accordance with another preferred embodiment of the present invention, FIG. 14 illustrates a section in an AA' direction of the light emitting device package in FIG. 13, and FIG. 18 illustrates a perspective view of the first reflective cup 122', the second reflective cup 124' and the connection pad 126 shown in FIG. 13.

The first lead frame 142-1 of a first reflective cup 122' shown in FIG. 18 includes a first bent portion 512-1 and a first horizontal portion 514-1, and the second lead frame 144-1 of a second reflective cup 124' includes a second bent portion 522-1 and a second horizontal portion 524-1. Different from the first bent portion 512 and the second bent portion 522 in FIG. 17, the first bent portion 512-1 and the second bent portion 522-1 in FIG. 18 have no holes therein.

Figure 15:
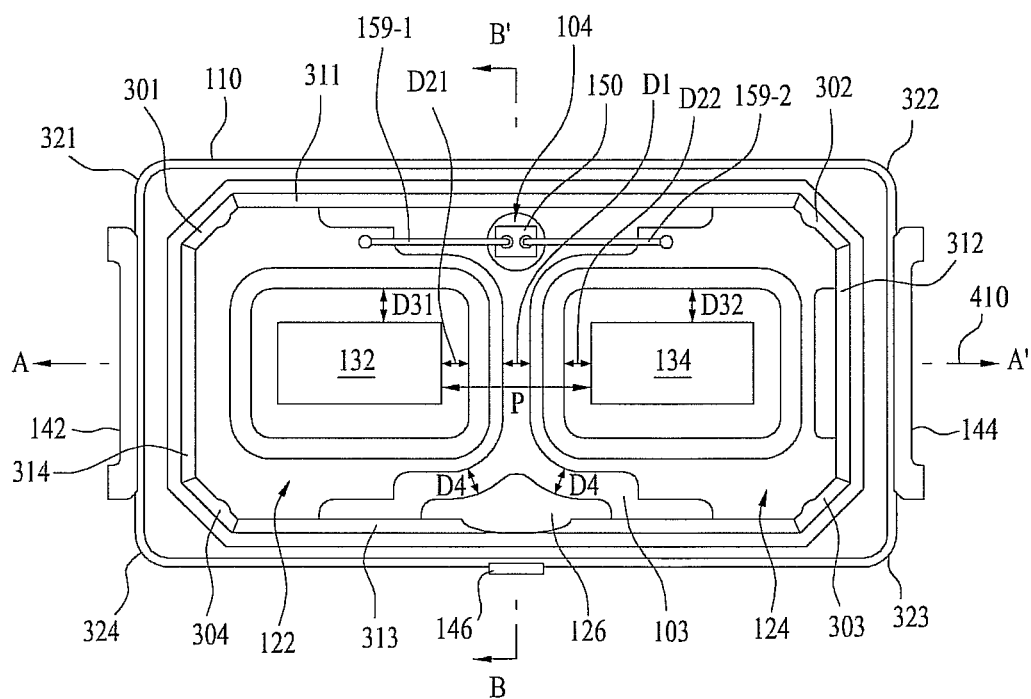
FIG. 15 illustrates a plan view of a light emitting device package in accordance with another preferred embodiment of the present invention.
Figure 16:
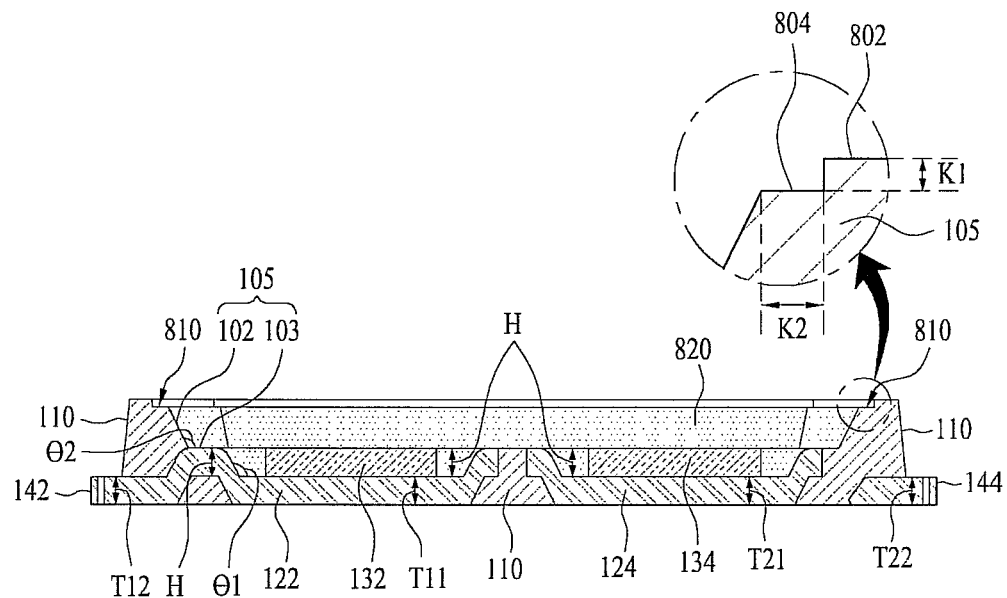
FIG. 16 illustrates a section in an AA' direction of the light emitting device package in FIG. 15.
Figure 19:
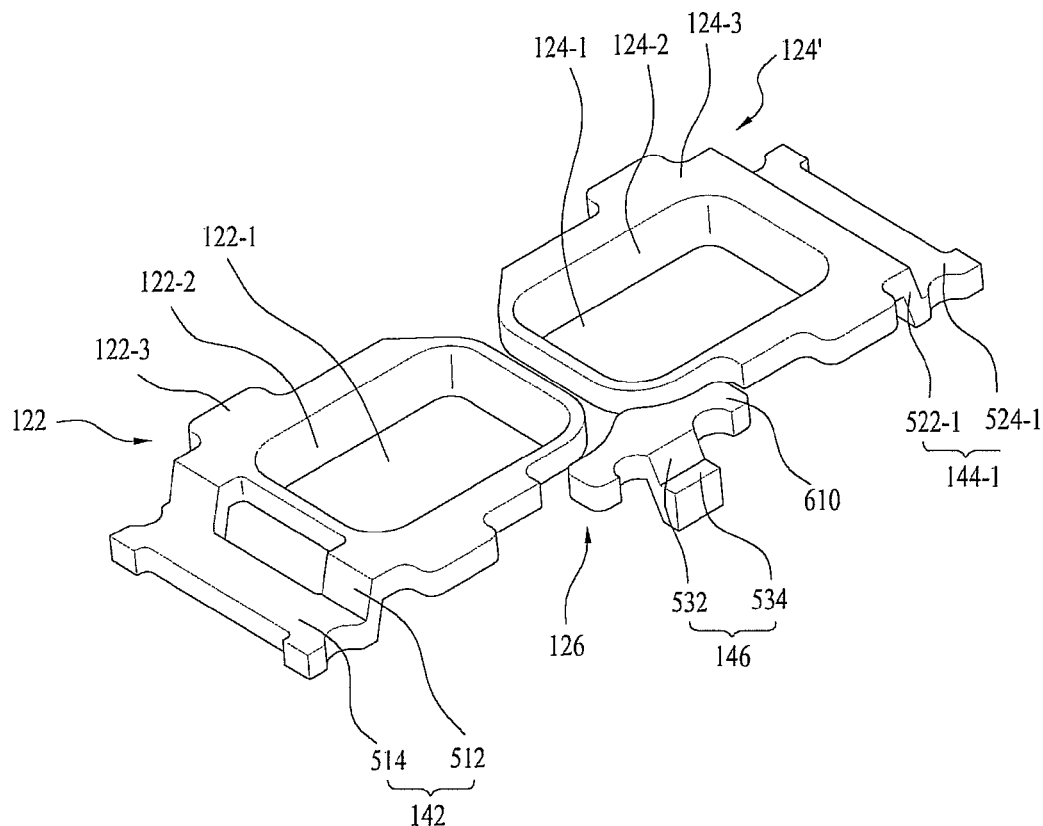
FIG. 19 illustrates a perspective view of the first reflective cup, the second reflective cup and the connection pad shown in FIG. 15.

FIG. 15 illustrates a plan view of a light emitting device package in accordance with another preferred embodiment of the present invention, FIG. 16 illustrates a section in an AA' direction of the light emitting device package in FIG. 15, and FIG. 19 illustrates a perspective view of the first reflective cup, the second reflective cup and the connection pad shown in FIG. 15.

The first lead frame 142 of the first reflective cup 122 shown in FIG. 19 includes a first bent portion 512 and a first horizontal portion 514, and the second lead frame 144-1 of a second reflective cup 124' includes a second bent portion 522-1 and a second horizontal portion 524-1. The first bent portion 512 in FIG. 19 is identical to one in FIG. 17, and the second bent portion 522-1 in FIG. 19 is identical to one in FIG. 18.

That is, though the first bent portion 512 of the first lead frame 142 of the first reflective cup 122 in FIG. 19 has at least one hole therein, the second bent portion 522-1 of the second lead frame 144-1 of the second reflective cup 124' may have no hole therein.

Figure 20:
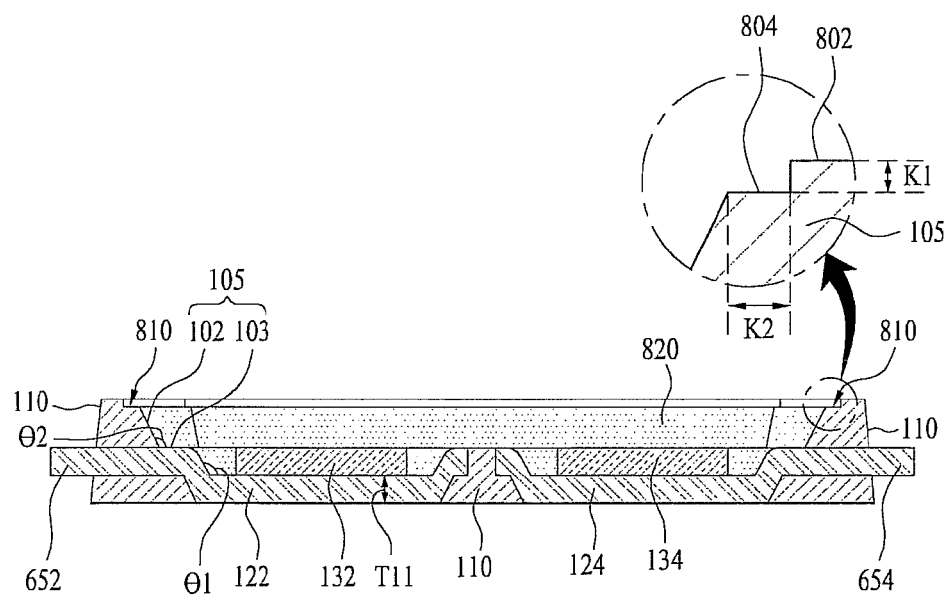
FIG. 20 illustrates a section of a first lead frame of a first reflective cup, and a second lead frame of a second reflective cup in accordance with another preferred embodiment of the present invention.

FIG. 20 illustrates a section of a first lead frame 652 of a first reflective cup 122, and a second lead frame 654 of a second reflective cup 124 in accordance with another preferred embodiment of the present invention.

Referring to FIG. 20, the first lead frame 652 is connected to the upper side 122-3 of the first reflective cup 122, and extends through the first side 210 of the body 110 to be exposed to an outside of the body 110. The first lead frame 652 can extend on the same plane with the upper side 122-3 of the first reflective cup 122. Also, the portion of the first lead frame 652 exposed from an outside of the first side 210 of the body 110 can also extend in parallel to the upper side 122-3 of the first reflective cup 122.

The second lead frame 654 is connected to the upper side 124-3 of the second reflective cup 124, and extends through the second side 220 of the body 110 to be exposed to an outside of the body 110. The second lead frame 654 can extend on the plane with the upper side 124-3 of the second reflective cup 124. Also, the portion of the second lead frame 654 exposed from an outside of the second side 220 of the body 110 can also extend in parallel to the upper side 124-3 of the second reflective cup 124.

Figure 21:
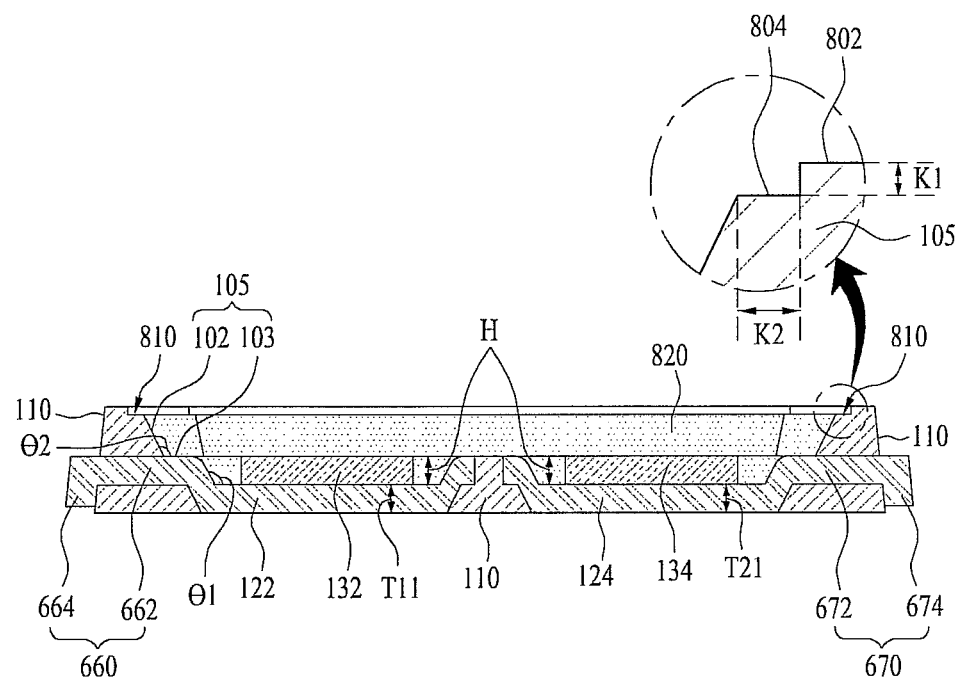
FIG. 21 illustrates a section of a first lead frame of a first reflective cup, and a second lead frame of a second reflective cup in accordance with another preferred embodiment of the present invention.

FIG. 21 illustrates a section of a first lead frame 660 of a first reflective cup 122, and a second lead frame 670 of a second reflective cup 124 in accordance with another preferred embodiment of the present invention.

Referring to FIG. 21, the first lead frame 660 of the first reflective cup 122 is connected to the upper side 122-3 of the first reflective cup 122, and extends through the first side 210 of the body 110 to be exposed to an outside of the body 110. The first lead frame 660 can include a horizontal portion 662 and an exposed bent portion 664.

The horizontal portion 662 is connected to the upper side 122-3 of the first reflective cup 122, on the same plane with the upper side 122-3, and can be positioned in the body 110.

The exposed bent portion 664 can be a portion connected to the horizontal portion 662 and exposed to an outside of the first side 210 of the body 110. The exposed bent portion 664 can be in contact with an outside circumference of the first side 210 of the body 110.

The second lead frame 670 of the second reflective cup 124 is connected to the upper side 124-3 of the second reflective cup 124, and extends through the second side 220 of the body 110 to be exposed to an outside of the body 110. The second lead frame 670 can include a horizontal portion 672 and an exposed bent portion 674.

The horizontal portion 672 is connected to the upper side 124-3 of the second reflective cup 124, on the same plane with the upper side 124-3, and can be positioned in the body 110. The exposed bent portion 664 can be a portion connected to the horizontal portion 672 and exposed to an outside of the second side 220 of the body 110. The exposed bent portion 674 can be in contact with an outside circumference of the second side 210 of the body 110.

Figure 27:
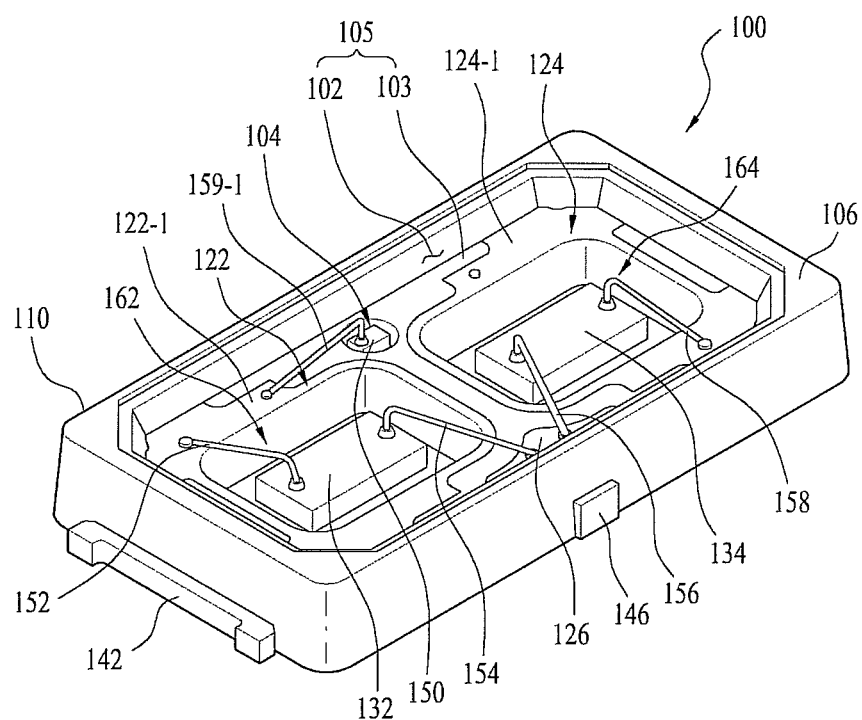
FIG. 27 illustrates a perspective view of a light emitting device package in accordance with another preferred embodiment of the present invention.
Figure 28:
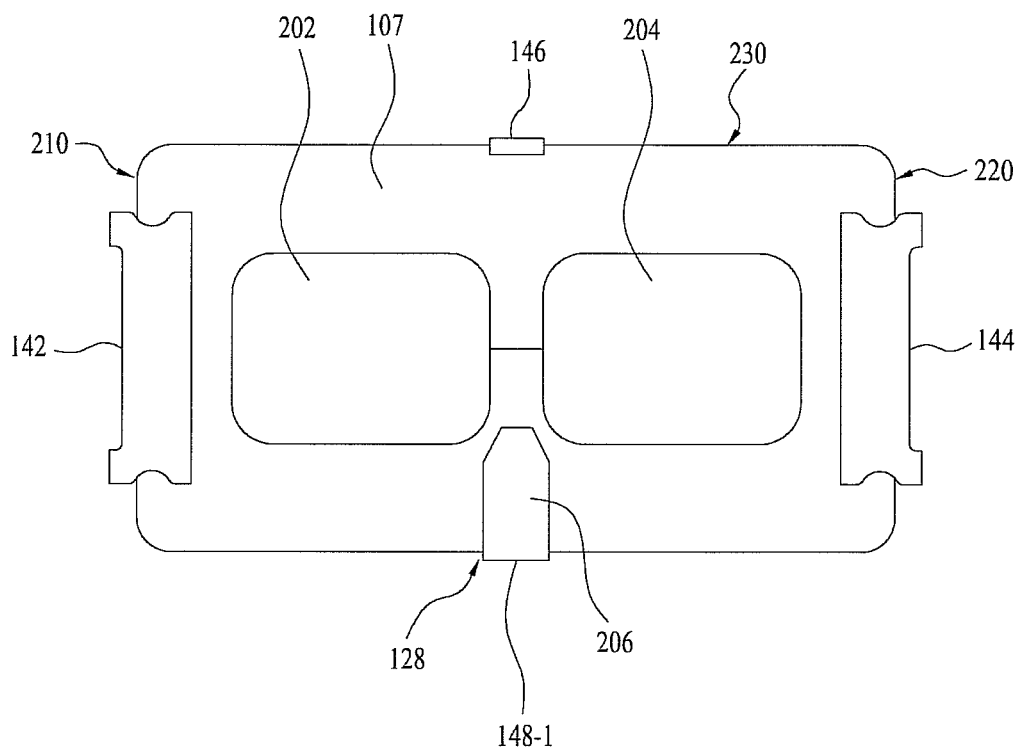
FIG. 28 illustrates a bottom view of the light emitting device package in FIG. 27.
Figure 29:
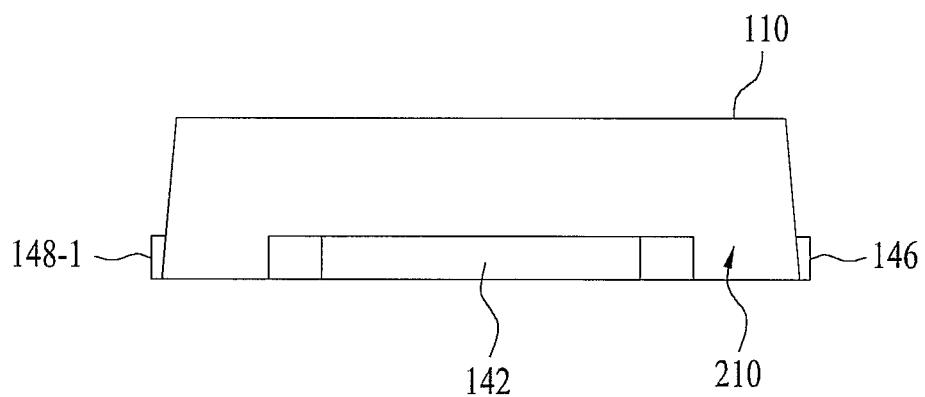
FIGS. 29~32 illustrate side views of the light emitting device package in FIG. 27, respectively.
Figure 30:
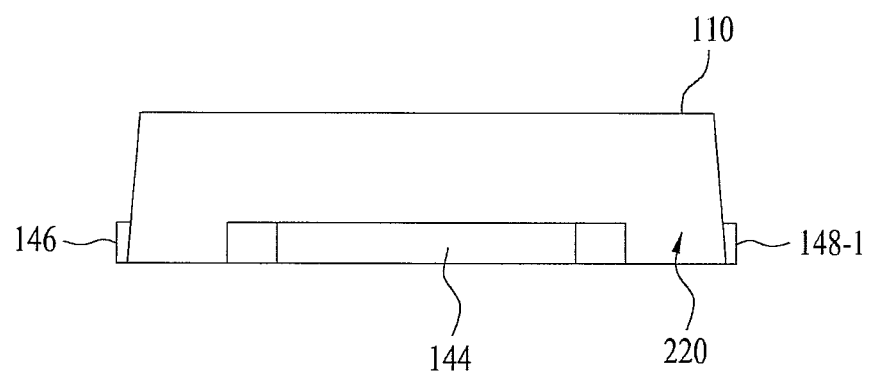
Figure 31:
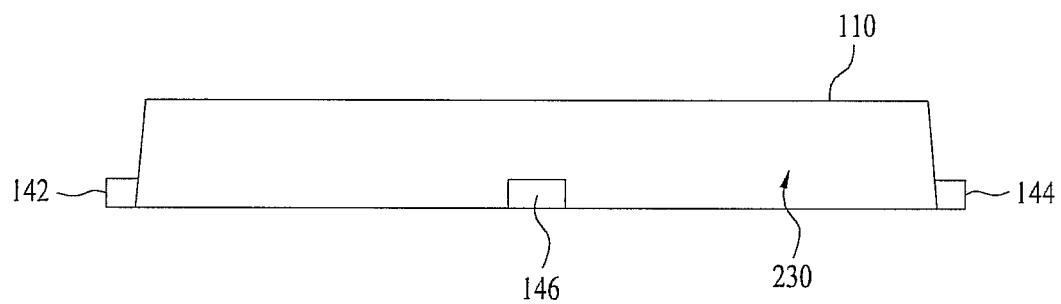
Figure 32:
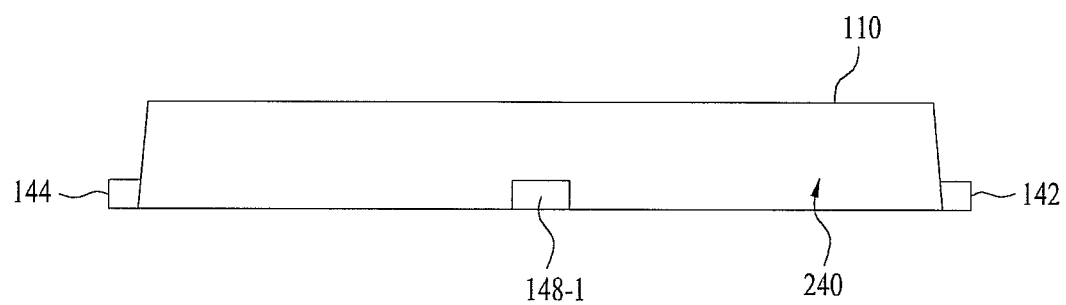
Figure 33:
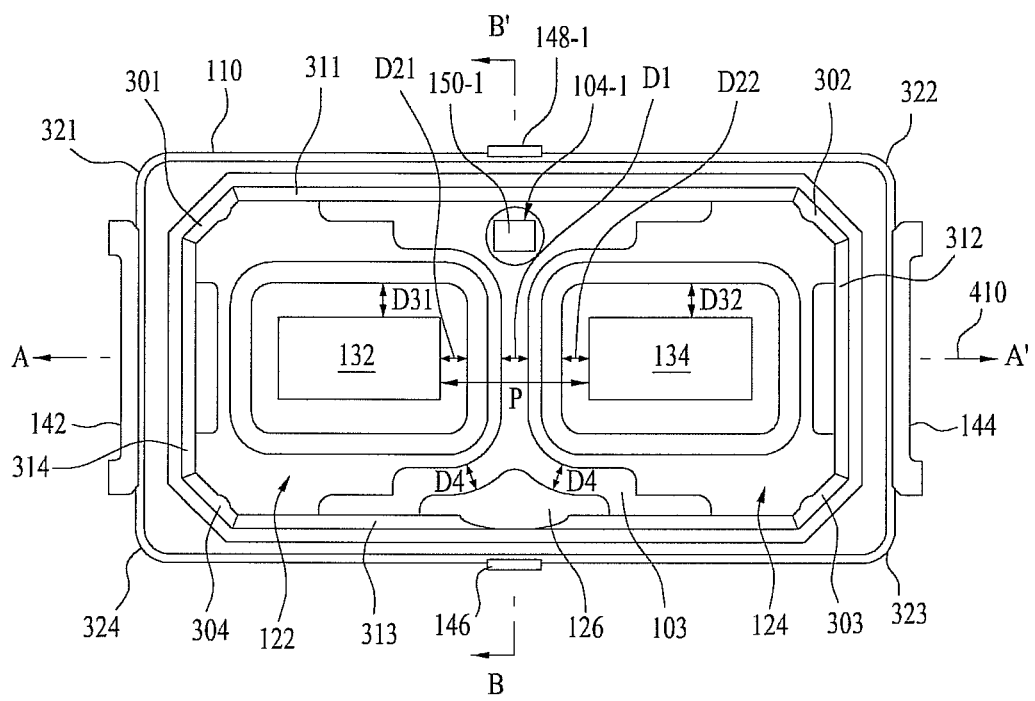
FIG. 33 illustrates a plan view of the light emitting device package in FIG. 27.
Figure 34:
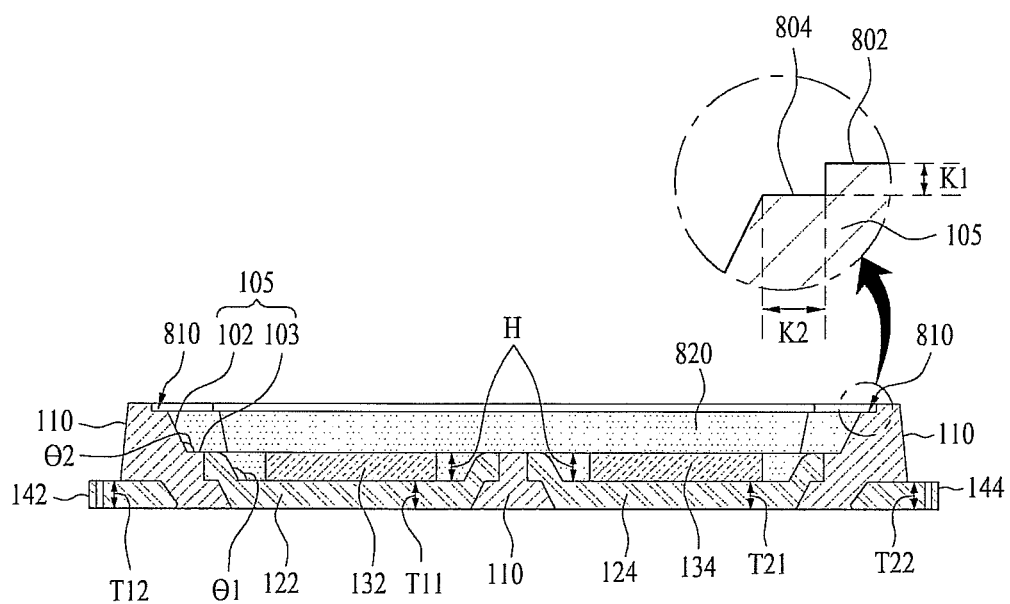
FIG. 34 illustrates a section in an AA' direction of the light emitting device package in FIG. 27.
Figure 35:
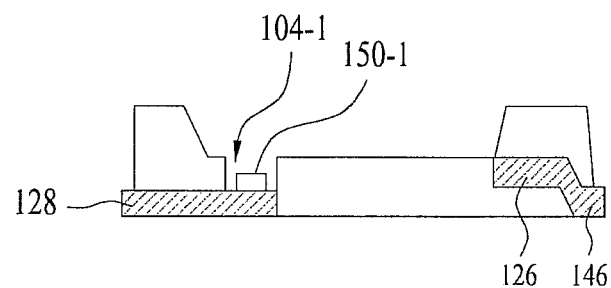
FIG. 35 illustrates a section in a BB' direction of the light emitting device package in FIG. 27.
Figure 39:
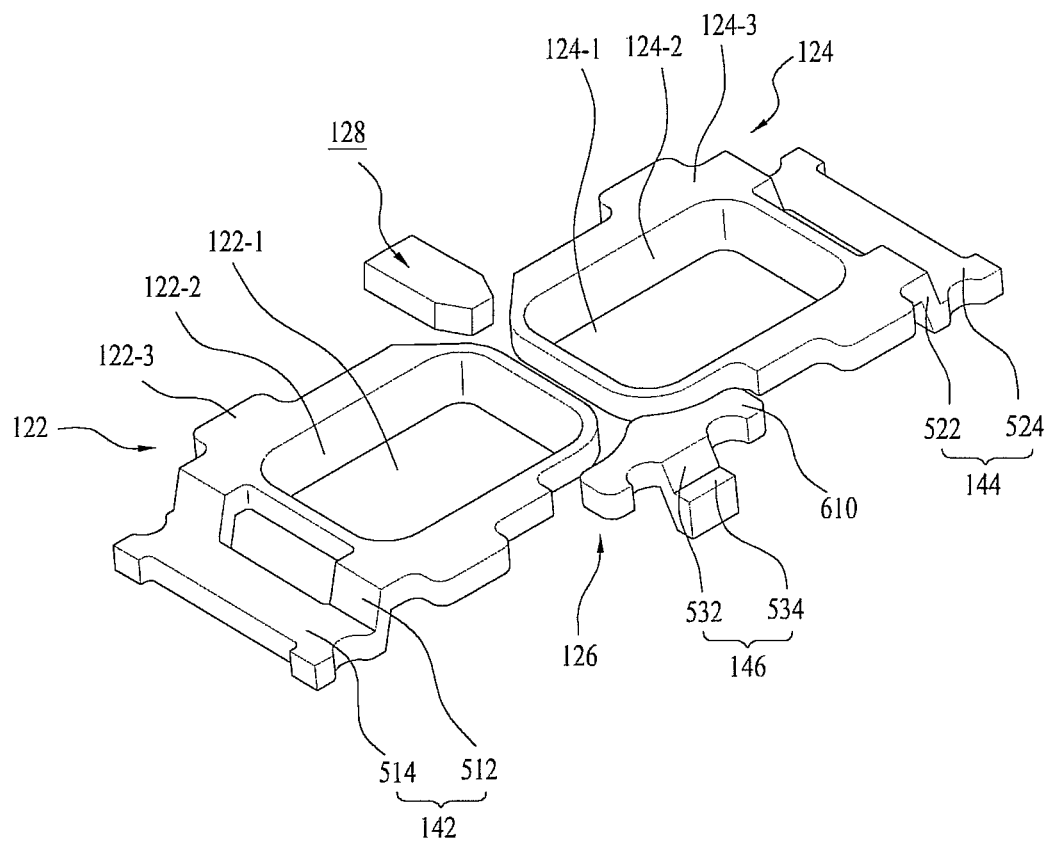
FIG. 39 illustrates a perspective view of the first reflective cup, the second reflective cup, the connection pad, and the Zener pad in FIG. 27.

FIG. 27 illustrates a perspective view of a light emitting device package 100-1 in accordance with another preferred embodiment of the present invention, FIG. 28 illustrates a bottom view of the light emitting device package in FIG. 27, FIGS. 29~32 illustrate side views of the light emitting device package 100-1 in FIG. 27 respectively, FIG. 33 illustrates a plan view of the light emitting device package in FIG. 27, FIG. 34 illustrates a section in an AA' direction of the light emitting device package in FIG. 27, FIG. 35 illustrates a section in a BB' direction of the light emitting device package in FIG. 27, and FIG. 39 illustrates a perspective view of the first reflective cup, the second reflective cup, the connection pad, and the Zener pad in FIG. 27. Parts having reference symbols the same with parts in FIGS. 1 to 9 illustrate identical parts, and description duplicated with previous description will be omitted or briefed.

Referring to FIGS. 27 to 35, and 39, the light emitting device package 100-1 includes a body 110, a first reflective cup 122, a second reflective cup 124, a connection pad 126, a Zener pad 128, a first semiconductor light emitting device 132, a second semiconductor light emitting device 134, a Zener diode 150-1, an insulating member 109, and wires 152~158 and 159-1.

The Zener pad 128 can be disposed below a top surface of the body 110. That is, the Zener pad 128 can be disposed below the top surface 103 of the body 110 spaced from the first reflective cup 122, the second reflective cup 124, and the connection pad 126.

The Zener pad 128 can have one end exposed from at least one of a rear side and a side of the body 110. For an example, the Zener pad 128 can be exposed from the rear side 107 of the body 110. And, the one end 148 of the Zener pad 128 can be exposed and passed through one side of the body 110, for an example, a third side 230.

The connection pad 126 is disposed adjacent to any one of opposite sides 102 of the body cavity 105, and the Zener pad 128 can be disposed adjacent to the other one of opposite sides 102 of the body cavity 105.

For an example, the connection pad 126 is disposed adjacent to any one 311 of the opposite first sides 311 and 313 or 312 and 314, and the Zener pad 128 is disposed adjacent to the other one of the opposite first sides 311 and 313 or 312 and 314.

And, the connection pad 126 can have a center aligned with a center of any one 311 of the opposite first sides, and the Zener pad 128 can have a center aligned with a center of the other one 313 of the opposite first sides.

And, the connection pad 126 and the Zener pad 128 can be aligned to face each other. For an example, the center of the connection pad 126 can be aligned with the center of the Zener pad 128.

The top surface of the body 110 has a recess 104-1 spaced from the first reflective cup 122, the second reflective cup 124, and the connection pad 126. For an example, the recess 104-1 can be formed in the top surface 103 of the body 110. The recess 104-1 exposes an upper side of the Zener pad 128. In this instance, the upper side of the Zener pad 128 is the other side of a rear side 206 of the Zener pad 128. Except that the recess 104-1 exposes the upper side of the Zener pad 128, the recess 104-1 is identical to the recess 104 in FIG. 1.

Referring to FIG. 35, the Zener pad 128 has a bar shape, and the Zener diode 150 is disposed on the Zener pad 128. As another embodiment, the Zener pad 128 can include a bent portion (not shown) having a shape identical to the bent portion 532 of the connection pad 126 in FIG. 17. Since the Zener pad 128 has the Zener diode 150 disposed thereon, the upper side of the Zener pad 128 can be lower than the upper side 610 of the connection pad 126. The Zener pad 128 can have a thickness of 200 μm~300 μm.

The Zener diode 150 has electrodes with polarities different from each other.

Figure 36:
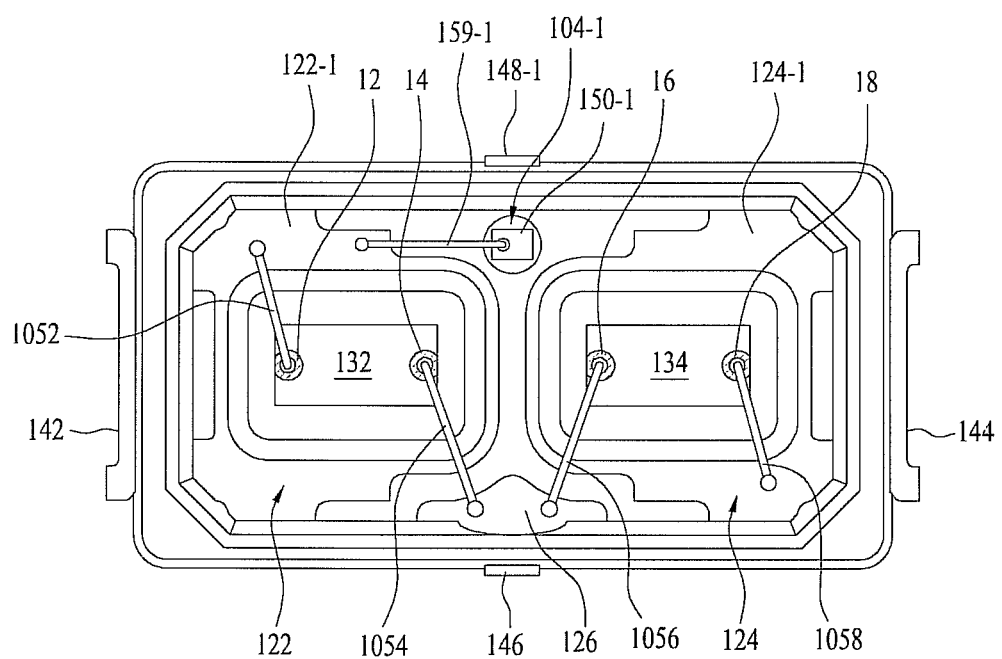
FIG. 36 illustrates a plan view of the light emitting device package in FIG. 27, showing serial connection between the light emitting devices.
Figure 40:
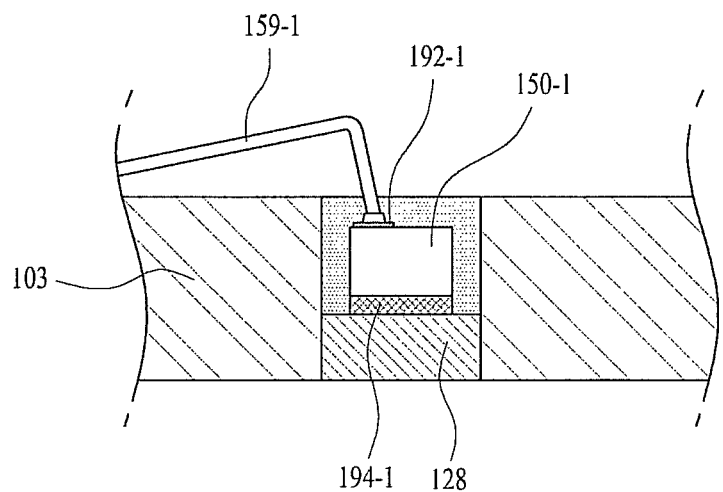
FIG. 40 illustrates a section of the recess and the Zener diode in FIG. 27.

FIG. 40 illustrates a section of the recess 104-1 and the Zener diode 150-1 in FIG. 27, and FIG. 36 illustrates a plan view of a light emitting device package 100-1 in FIG. 27, showing serial connection between the light emitting devices therein.

Referring to FIGS. 36 and 40, the Zener diode 150-1 can have electrodes 192-1 and 194-1 with polarities different from each other. For an example, the Zener diode 150 can have a fifth electrode 192-1 and a sixth electrode 194-1. The fifth electrode 192-1 and the sixth electrode 194-1 can have polarities different from each other. The fifth electrode 192 and the sixth electrode 194 can have power supplied thereto from power sources different from each other.

The first wire 1052 can connect the first electrode 12 of the first semiconductor light emitting device 132 to the first reflective cup 122 electrically, and the fourth wire 1058 can connect the fourth electrode 18 of the second semiconductor light emitting device 134 to the second reflective cup 124, electrically.

The second wire 1054 can connect the second electrode 14 of the first semiconductor light emitting device 132 to the connection pad 126 electrically, and the third wire 1056 can connect the third electrode 16 of the second semiconductor light emitting device 134 to the connection pad 126, electrically.

And, the fifth wire 159-1 connects the fifth electrode 192-1 to the first reflective cup 122 electrically, and the sixth electrode 194-1 is directly connected to the Zener pad 128. And, the Zener pad 128 can be connected to the second semiconductor light emitting device 134, electrically. For an example, the fifth wire 159-1 has one end bonded to the fifth electrode 192-1, and the other end bonded to the upper side 122-1 of the first reflective cup 122. The sixth electrode 194-1 can be directly bonded to the Zener pad 128 exposed from the recess 104-1, and the Zener pad 128 can be connected to the second reflective cup 124, electrically.

Figure 37:
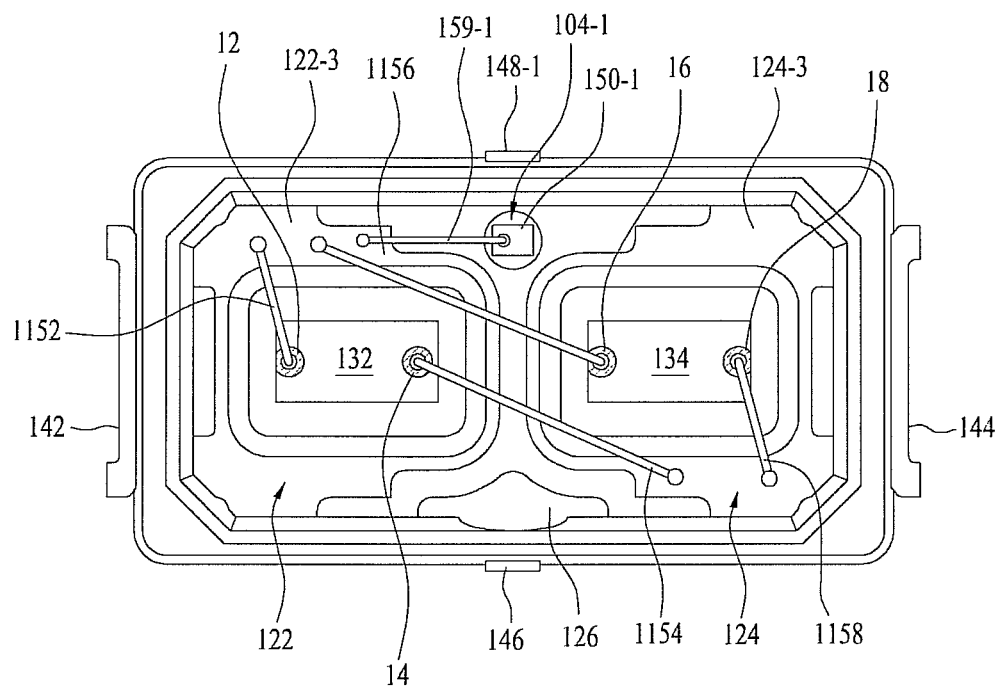
FIG. 37 illustrates a plan view of the light emitting device package in FIG. 27, showing parallel connection between the light emitting devices.

FIG. 37 illustrates a plan view of a light emitting device package 100-1 in FIG. 27, showing parallel connection between the light emitting devices. As shown in FIG. 37, connection of the first to fourth wires 1152 to 1158 can be identical to the description with reference to FIG. 11, and connection of the fifth wire 159-1 and the Zener diode 150 can be identical to the description with reference to FIGS. 36 and 40. And, the Zener pad 128 can be connected to the second semiconductor light emitting device 134, electrically.

Figure 38:
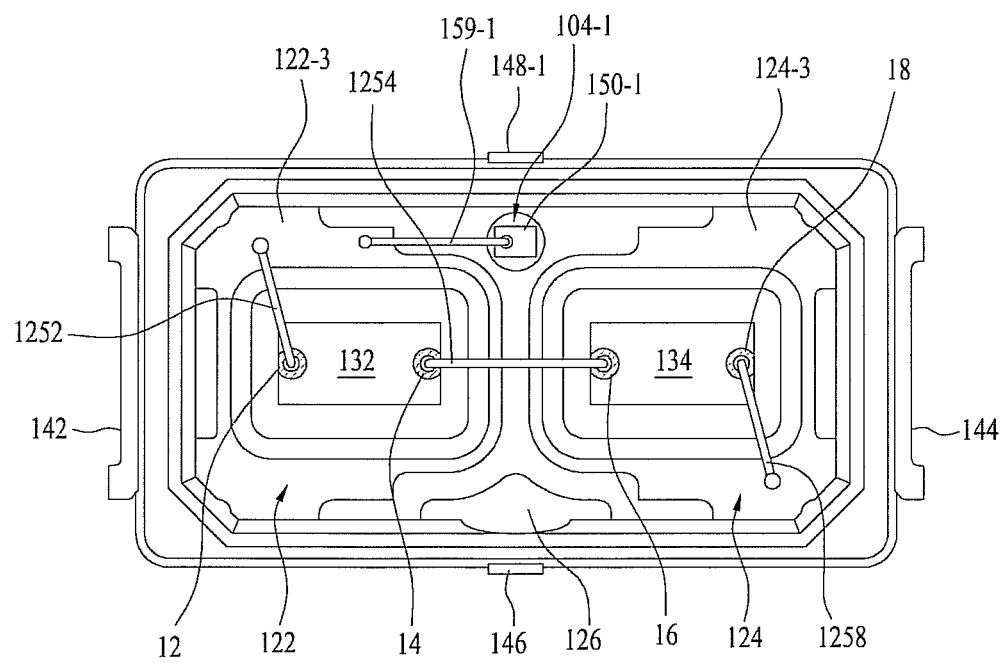
FIG. 38 illustrates a plan view of the light emitting device package in FIG. 27, showing serial connection between the light emitting devices.

FIG. 38 illustrates a plan view of the light emitting device package in FIG. 27, showing serial connection between the light emitting devices. As shown in FIG. 38, connection of the first, second, fourth wires 1252, 1254, and 1258 can be identical to the description with reference to FIG. 12, and connection of the fifth wire 159-1 and the Zener diode 150 can be identical to the description with reference to FIGS. 36 and 40. And, the Zener pad 128 can be connected to the second reflective cup 124, electrically.

Though the fifth wire 159-1 is connected to the first reflective cup 122 in any one of FIGS. 36 to 38, the connection is not limited to this, but in another embodiment, the fifth wire 159-1 can be connected to the second reflective cup 124, and the Zener pad 128 can be connected to the first reflective cup 122, electrically.

The insulating member 109 is filled in the recess 104 to cover the Zener diode 150 and the Zener pad 128.

Figure 41:
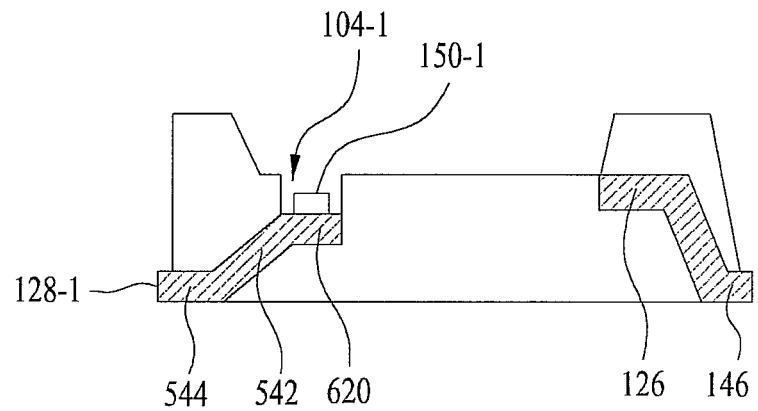
FIG. 41 illustrates a section of a light emitting device package in accordance with another preferred embodiment of the present invention, having a Zener pad.
Figure 42:
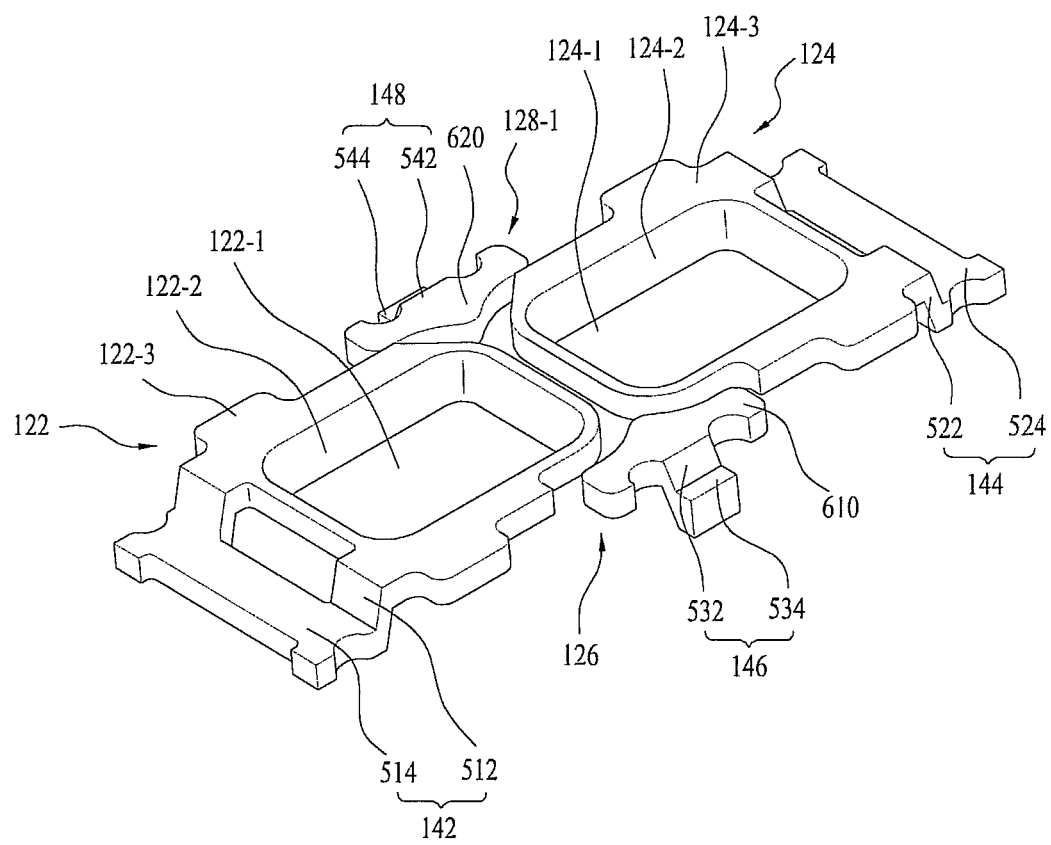
FIG. 42 illustrates a perspective view of the Zener pad and the connection pad in FIG. 41.

FIG. 41 illustrates a section of a light emitting device package in accordance with another preferred embodiment of the present invention, having a Zener pad 128-1, and FIG. 42 illustrates a perspective view of the Zener pad 128-1and the connection pad 126 in FIG. 41.

Referring to FIGS. 41 and 42, the Zener pad 128-1 has an upper side 620 and one end 148-1 of which one portion is exposed from the body 110 passed through a fourth side 240 of the body 110. The upper side 620 of the Zener pad 128-1 can be exposed from a bottom of the body cavity 105 through the recess 104-1. Hereafter, the one end 148-1 of the Zener pad 128-1 will be called as "a fourth lead frame".

The fourth lead frame 148-1 is connected to the upper side 620 of the Zener pad 128-1. The fourth lead frame 148-1 can have a fourth bent portion 542 and a fourth horizontal portion 544.

The fourth bent portion 542 is connected to the upper side 620 and bent. For an example, the fourth bent portion 542 can be bent from the upper side 620 of the Zener pad 128-1 to the rear side 107 of the body 110. In this instance, an angle between the fourth bent portion 542 and the upper side 620 of the Zener pad 128-1 can be an acute angle. For an example, the angle between the fourth bent portion 542 and the upper side 620 of the Zener pad 128-1 can be smaller than an angle between the third bent portion 532 of the third lead frame 146 and the upper side 610 of the connection pad 126.

The upper side 620 of the Zener pad 128-1 can be disposed lower than the upper side 610 of the connection pad 126. For an example, a spaced distance between the upper side 620 of the Zener pad 128-1 and the rear side of the body 110 can be smaller than a spaced distance between the upper side 610 of the connection pad 126 and the rear side 107 of the body 110.

The upper side 620 of the Zener pad 128-1 can have a thickness of 200 μm~300 μm, and the fourth lead frame 148-1 can have a thickness of 0.2 mm~0.3 mm.

Though FIG. 42 illustrates the Zener pad 128-1 having a shape identical to the connection pad 126, the shape of the Zener pad 128-1 is not limited to this, but the Zener pad 128-1 can be embodied in a variety of shapes, including an upper side having the Zener diode disposed thereon, a bent portion bent from the upper side, and a horizontal portion exposed from one side of the body 110.

The fourth horizontal portion 544 can be connected to the fourth bent portion 542 and in parallel with the upper side 620. The fourth horizontal portion 544 can have one portion exposed from the fourth side 240 of the body 110 and/or the rear side 107. The first to fourth bent portions 512, 522, 532 and 544 can be disposed in the body 110 without exposure to an outside of the body 110.

Figure 43:
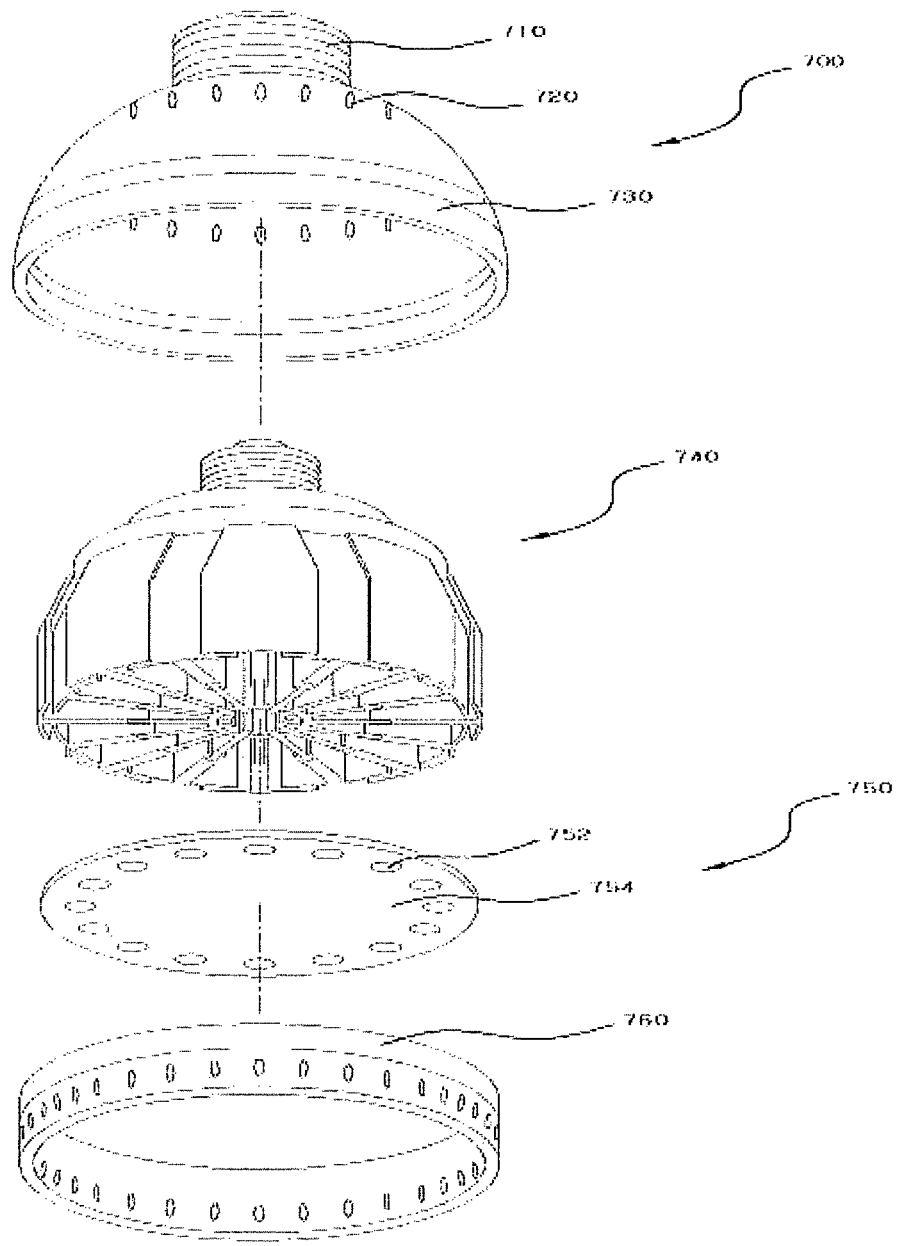
FIG. 43 illustrates an exploded perspective view of a lighting device having a light emitting device package in accordance with a preferred embodiment of the present invention.

FIG. 43 illustrates an exploded perspective view of a lighting apparatus having a light emitting device package in accordance with a preferred embodiment of the present invention. As shown in FIG. 43, the lighting apparatus includes a light source 750 to project a light, a housing 700 in which the light source 750 is installed, a heat dissipation unit 740 to dissipate heat from the light source 750, and a holder 760 to fasten the light source 750 and the heat dissipation unit 740 to the housing 700.

The housing 700 includes a socket connection part 710 connected to the housing 700 to an electric socket (not shown) and a body part 730 connected to the socket connection part for housing the light source 750. The body part 730 can have an air hole 720 passing therethrough.

The body part 730 of the housing 700 has a plurality of air holes 720. The air hole 720 may be singular or plural disposed radially as shown in the drawing. Besides this, the arrangement of the air hole 720 can vary.

And, the light source 750 has a plurality of light emitting device packages 752 provided on a substrate 754. The substrate 754 can have a shape that can be placed in an opening of the housing 700, and can be formed of a material having high heat conductivity for transfer of heat to the heat dissipation unit 740.

And, a holder 760 is provided under the light source, including a frame and air holes. Though not shown, an optical member can be provided to a lower side of the light source 750 for causing the light from the light emitting device package 752 of the light source 750 to diverge, scatter, or converge. The lighting device of the embodiment uses the light emitting device package of the foregoing embodiments, extends a lifetime of the light emitting device package mounted thereto and prevents optical interference from taking place.

Figure 44:
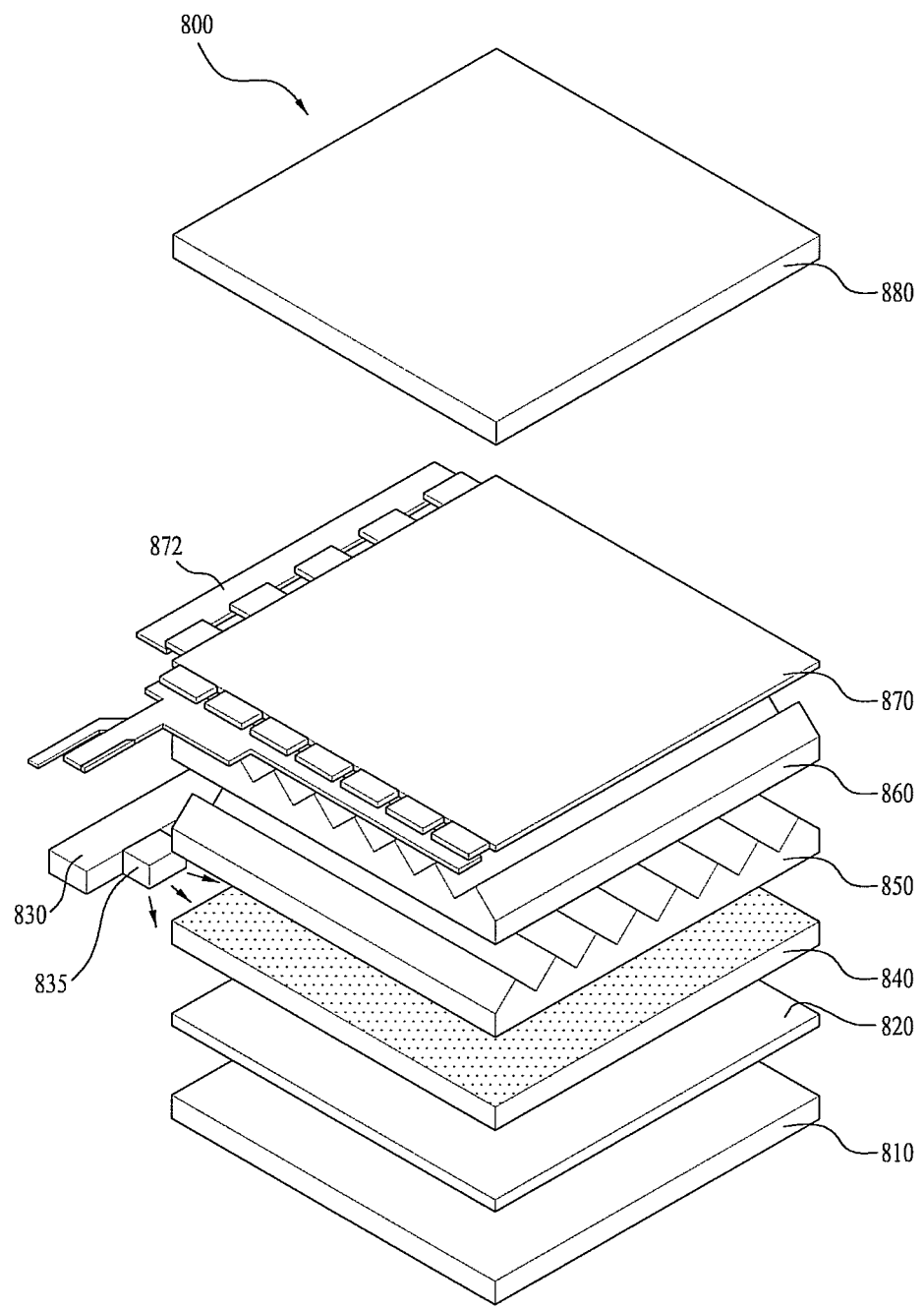
FIG. 44 illustrates an exploded perspective view of a display apparatus having a light emitting device package in accordance with a preferred embodiment of the present invention.

FIG. 44 illustrates an exploded perspective view of a display apparatus having a light emitting device package in accordance with a preferred embodiment of the present invention.

Referring to FIG. 44, the display apparatus 800 includes a bottom cover 810, a reflective plate 820 provided on the bottom cover 810, a light source module 830 and 835 to emit light, a light guide plate 840 disposed in front of the reflective plate 820 to guide the light emitted from the light source module 830 and 835 to a front of the display apparatus, optical sheets including prism sheets 850 and 860 disposed in front of the light guide plate 840, a display panel 870 disposed in front of the optical sheets 850 and 860, an image signal output circuit 872 electrically connected with the display panel 870 to supply an image signal, and a color filter 880 disposed in front of the display panel 870. In this instance, the bottom cover 810, the reflective plate 820, the light source module 830 and 835, the light guide plate 840, and the optical sheets can construe a backlight unit.

The light source module includes a light emitting device package 835 on a substrate 830. In this instance, the substrate 830 can be a PCB or the like, and the light emitting device package 835 can be one in FIG. 1.

The bottom cover 810 can accommodate elements of the display apparatus 800. And, the reflective plate 820 can be provided as a separate element as shown in the drawing, or can be provided as a material with a high reflectivity is coated over a rear of the light guide plate 840 or a front of the bottom cover 810.

In this instance, the reflective plate 820 can be made of material having high reflectivity and capable of being formed into an ultra thin structure such as PET (PolyEthylene Terephtalate).

And, the light guide plate 830 serves to scatter the light from the light source module for uniform distribution of the light to an entire region of a screen of the liquid crystal display panel. Accordingly, the light guide plate 830 is formed of a material having good refractivity and transmissivity, such as PolyMethylMethAcrylate PMMA, PolyCarbonate PC, or PolyEthylene PE.

And, the first prism sheet 850 can be formed of a polymer having light transmissivity and elasticity on one side of a supporting film. The polymer can have a prism layer having a plurality of three dimensional structures formed thereon, repeatedly. In this instance, as shown, the plurality of patterns can be a stripe type with repetitive ridges and grooves.

And, a direction of the ridges and the grooves in the second prism sheet 860 can be perpendicular to a direction of the ridges and the grooves in the first prism sheet 850, for uniform distribution of the light from the light source module and the reflective sheet to an entire surface of the display panel 870.

And, though not shown, each of the prism sheets can have a protective sheet provided thereon by providing a protective layer having light diffusing particles and a binder on both sides of the supporting film. And, the prism layer can be formed of a polymer material selected from a group having polyurethane, styrene butadiene copolymer, polyacrylate, polymethacrylate, polymethylmethacrylate, polyethyleneterephthalate elastomer, polyisoprene, and polysilicone.

And, though not shown, a diffusion sheet can be disposed between the light guide plate 840 and the first prism sheet 850. The diffusion sheet can be formed of a material selected from a polyester group and a polycarbonate group, for widening a light projection angle to the maximum by refraction and scattering of the light from the backlight unit. And, the diffusion sheet can includes a supporting layer having light diffuser contained therein, and a first layer and a second layer both without the light diffuser contained therein formed on a light forwarding surface (a first prism sheet direction) and a light incident surface (a reflective sheet direction), respectively.

In the embodiment, the diffusion sheet, the first prism sheet 850 and the second prism sheet construe the optical sheet. The optical sheet can be constructed of other combination, for an example, a microlens array, a combination of the diffusion sheet and the microlens array, a combination of one prism sheet and the microlens array, or so on.

As the display panel 870, a liquid crystal panel can be applied, and besides the liquid crystal panel 860, other kind of display apparatus which requires a light source can be applied. The display panel 870 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are disposed regularly like crystal. By utilizing a property of the liquid crystals in which a molecular arrangement varies with an external electric field, a picture is displayed.

The liquid crystal panel used in the display apparatus has an active matrix system, in which a transistor is used as a switch for controlling a voltage supplied to pixels. And, the liquid crystal display panel 870 has a color filter 880 on a front for each of pixels to transmit only red, green and blue lights of the light from the display panel 870, thereby displaying a picture.

The display apparatus of the embodiment uses the light source module having the light emitting device package of the embodiment, thereby preventing the lights from the light emitting devices 132 and 134 from interfering with each other.

As has been described, the light emitting device package of the present invention has the following advantages.

The light emitting device package of the present invention can improve light extraction efficiency and protect the wires.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package comprising:
   a body;
   a first reflective cup and a second reflective cup disposed in a top surface of the body and spaced apart from each other, wherein the first reflective cup and the second reflective cup are conductive;
   a connection pad disposed in the top surface of the body and spaced apart from the first reflective cup and the second reflective cup;
   a recess formed in the top surface of the body and spaced apart from the first reflective cup, the second reflective cup, and the connection pad;
   a first semiconductor light emitting device disposed in the first reflective cup;
   a second semiconductor light emitting device disposed in the second reflective cup; and
   a Zener diode disposed in the recess,
   wherein the first reflective cup and the second reflective cup are recessed from the top surface of the body, and the body is positioned around the first reflective cup, the second reflective cup, the connection pad, and the recess, and includes a reflective wall extended upward from the top surface of the body, and at least a portion of each of the first reflective cup and the second reflective cup extends through the body and is exposed to an outside of the body.

2. The light emitting device package as claimed in claim 1, wherein the first reflective cup, the second reflective cup, and the connection pad are formed of a material different from the body.

3. The light emitting device package as claimed in claim 1, wherein the connection pad and the recess are aligned to face each other and the recess has a depth greater than or equal to ½ of a height of the Zener diode.

4. The light emitting device package as claimed in claim 1, wherein the first semiconductor light emitting device includes a first electrode and a second electrode having polarities different from each other, the second semiconductor light emitting device includes a third electrode and a fourth electrode having polarities different from each other, and the Zener diode includes a fifth electrode and a sixth electrode having polarities different from each other.

5. The light emitting device package as claimed in claim 4, further comprising:
   a first wire for connecting the first electrode to the first reflective cup,
   a second wire for connecting the second electrode to the connection pad,
   a third wire for connecting the connection pad to the third electrode,
   a fourth wire for connecting the fourth electrode to the second reflective cup,
   a fifth wire for connecting the fifth electrode to the first reflective cup, and
   a sixth wire for connecting the sixth electrode to the second reflective cup.

6. The light emitting device package as claimed in claim 4, further comprising:
   a first wire for connecting the first electrode to the first reflective cup,
   a second wire for connecting the second electrode to the second reflective cup,
   a third wire for connecting the first reflective cup to the third electrode,
   a fourth wire for connecting the fourth electrode to the second reflective cup,
   a fifth wire for connecting the fifth electrode to the first reflective cup, and
   a sixth wire for connecting the sixth electrode to the second reflective cup.

7. The light emitting device package as claimed in claim 4, further comprising:
   a first wire for connecting the first electrode to the first reflective cup,
   a second wire for connecting the second electrode to the third electrode,
   a third wire for connecting the fourth electrode to the second reflective cup,
   a fifth wire for connecting the fifth electrode to the first reflective cup, and
   a sixth wire for connecting the sixth electrode to the second reflective cup.

8. A light emitting device package comprising:
   a body;
   a first reflective cup and a second reflective cup positioned in a top surface of the body spaced apart from each other;
   a connection pad disposed in the top surface of the body spaced apart from the first reflective cup and the second reflective cup;
   a Zener pad disposed in the body spaced apart from the first reflective cup, the second reflective cup, and the connection pad;
   a recess formed in the top surface of the body to expose an upper side of the Zener pad;
   a first semiconductor light emitting device disposed in the first reflective cup;
   a second semiconductor light emitting device disposed in the second reflective cup;
   a Zener diode disposed on an upper side of the Zener pad exposed from the recess; and
   a reflective wall positioned around the first reflective cup, the second reflective cup, the connection pad, the recess, and the Zener pad, and extended upward from the top surface of the body, wherein the first reflective cup and the second reflective cup are recessed from the top surface of the body, and at least a portion of each of the first reflective cup and the second reflective cup extends through the body and is exposed to an outside of the body.

9. The light emitting device package as claimed in claim 8, wherein the Zener pad is connected to one of the first reflective cup and the second reflective cup, electrically.

10. The light emitting device package as claimed in claim 8, wherein the Zener pad has one end exposed from at least one of a bottom side or a side of the body.

11. The light emitting device package as claimed in claim 8, wherein the Zener pad and the connection pad are aligned to face each other and the Zener pad has an upper side lower than an upper side of the connection pad.

12. The light emitting device package as claimed in claim 8, wherein the first semiconductor light emitting device includes a first electrode and a second electrode having polarities different from each other, the second semiconductor light emitting device includes a third electrode and a fourth electrode having polarities different from each other, and the Zener diode includes a fifth electrode and a sixth electrode having polarities different from each other.

13. The light emitting device package as claimed in claim 12, further comprising:
    a first wire for connecting the first electrode to the first reflective cup,
    a second wire for connecting the second electrode to the connection pad,
    a third wire for connecting the connection pad to the third electrode,
    a fourth wire for connecting the fourth electrode to the second reflective cup, and
    a fifth wire for connecting the first reflective cup to the fifth electrode,
    wherein the sixth electrode is connected to the Zener pad and the Zener pad is connected to the second reflective cup, electrically.

14. The light emitting device package as claimed in claim 12, further comprising:
    a first wire for connecting the first electrode to the first reflective cup,
    a second wire for connecting the second electrode to the second reflective cup,
    a third wire for connecting the first reflective cup to the third electrode,
    a fourth wire for connecting the fourth electrode to the second reflective cup, and
    a fifth wire for connecting the first reflective cup to the fifth electrode,
    wherein the sixth electrode is connected to the Zener pad and the Zener pad is connected to the second reflective cup, electrically.

15. The light emitting device package as claimed in claim 12, further comprising:
    a first wire for connecting the first electrode to the first reflective cup,
    a second wire for connecting the second electrode to the third electrode,
    a third wire for connecting the fourth electrode to the second reflective cup, and
    a fifth wire for connecting the first reflective cup to the fifth electrode,
    wherein the sixth electrode is connected to the Zener pad and the Zener pad is connected to the second reflective cup, electrically.

16. The light emitting device package as claimed in claim 8, further comprising an insulating member for filling the recess to cover the Zener pad and the Zener diode.

17. The light emitting device package as claimed in claim 8, wherein the first reflective cup, the second reflective cup, the connection pad, and the Zener pad are formed of a material different from the body.

18. The light emitting device package as claimed in claim 17, wherein the first reflective cup and the second reflective cup are conductive.

19. A backlight unit, comprising:
    a bottom cover;
    a reflective plate provided on the bottom cover;
    a light guide plate disposed in front of the reflective plate;
    light source modules emitting light to the light guide plate, wherein the light source modules includes a substrate and light emitting device packages; and
    an optical sheet provided in front of the light guide plate, wherein each of the light emitting device packages comprises:
    a body;
    a first reflective cup and a second reflective cup disposed in a top surface of the body and spaced apart from each other, wherein the first reflective cup and the second reflective cup are conductive;
    a connection pad disposed in the top surface of the body and spaced apart from the first reflective cup and the second reflective cup;
    a recess formed in the top surface of the body and spaced apart from the first reflective cup, the second reflective cup, and the connection pad;
    a first semiconductor light emitting device disposed in the first reflective cup;
    a second semiconductor light emitting device disposed in the second reflective cup; and
    a Zener diode disposed in the recess,
    wherein the first reflective cup and the second reflective cup are recessed from the top surface of the body and the body is positioned around the first reflective cup, the second reflective cup, the connection pad, and the recess, and includes a reflective wall extended upward from the top surface of the body, and at least a portion of each of the first reflective cup and the second reflective cup extends through the body and is exposed to an outside of the body.

20. A display apparatus comprising:
    a display panel;
    a backlight unit emitting light to the display panel; and
    an image signal output circuit connected with the display panel to supply an image signal, wherein the backlight unit comprises:
    a bottom cover;
    a reflective plate provided on the bottom cover;
    a light guide plate disposed in front of the reflective plate;
    light source modules emitting light to the light guide plate, wherein the light source modules include a substrate and light emitting device packages; and
    an optical sheet provided in front of the light guide plate, wherein each of the light emitting device packages comprises:
    a body;
    a first reflective cup and a second reflective cup disposed in a top surface of the body and spaced apart from each other, wherein the first reflective cup and the second reflective cup are conductive;

a connection pad disposed in the top surface of the body and spaced apart from the first reflective cup and the second reflective cup;

a recess formed in the top surface of the body and spaced apart from the first reflective cup, the second reflective cup, and the connection pad;

a first semiconductor light emitting device disposed in the first reflective cup;

a second semiconductor light emitting device disposed in the second reflective cup; and a Zener diode disposed in the recess, wherein the first reflective cup and the second reflective cup are recessed from the top surface of the body, and the body is positioned around the first reflective cup, the second reflective cup, the connection pad, and the recess, and includes a reflective wall extended upward from the top surface of the body, and at least a portion of each of the first reflective cup and the second reflective cup extends through the body and is exposed to an outside of the body.

* * * * *